(12) United States Patent
Takeuchi et al.

(10) Patent No.: US 10,734,515 B2
(45) Date of Patent: Aug. 4, 2020

(54) SILICON CARBIDE SEMICONDUCTOR DEVICE AND MANUFACTURING METHOD THEREFOR

(71) Applicants: DENSO CORPORATION, Kariya, Aichi-pref. (JP); TOYOTA JIDOSHA KABUSHIKI KAISHA, Toyota-shi, Aichi-ken (JP)

(72) Inventors: Yuichi Takeuchi, Kariya (JP); Katsumi Suzuki, Toyota (JP); Yukihiko Watanabe, Nagakute (JP)

(73) Assignees: DENSO CORPORATION, Kariya (JP); TOYOTA JIDOSHA KABUSHIKI KAISHA, Toyota-shi (JP)

(*) Notice: Subject to any disclaimer, the term of this patent is extended or adjusted under 35 U.S.C. 154(b) by 0 days.

(21) Appl. No.: 16/304,752

(22) PCT Filed: Jun. 29, 2017

(86) PCT No.: PCT/JP2017/023988
§ 371 (c)(1),
(2) Date: Nov. 27, 2018

(87) PCT Pub. No.: WO2018/008527
PCT Pub. Date: Jan. 11, 2018

(65) Prior Publication Data
US 2019/0386131 A1    Dec. 19, 2019

(30) Foreign Application Priority Data

Jul. 5, 2016   (JP) .................... 2016-133675

(51) Int. Cl.
*H01L 29/78*   (2006.01)
*H01L 21/02*   (2006.01)
(Continued)

(52) U.S. Cl.
CPC .... *H01L 29/7811* (2013.01); *H01L 21/02529* (2013.01); *H01L 21/02579* (2013.01);
(Continued)

(58) Field of Classification Search
CPC ........... H01L 29/7811; H01L 21/02529; H01L 21/02579
(Continued)

(56) References Cited

U.S. PATENT DOCUMENTS

2005/0258454 A1* 11/2005 Kumar ................. H01L 27/098
257/211
2009/0200559 A1  8/2009 Suzuki et al.
(Continued)

FOREIGN PATENT DOCUMENTS

WO   2018/008526 A1   1/2018
WO   2018/008528 A1   1/2018
WO   2018/008529 A1   1/2018

OTHER PUBLICATIONS

U.S. Appl. No. 16/304,783, filed Nov. 27, 2018, Takeuchi et al.
U.S. Appl. No. 16/305,164, filed Nov. 28, 2018, Takeuchi et al.
U.S. Appl. No. 16/304,866, filed Nov. 27, 2018, Takeuchi et al.

*Primary Examiner* — Igwe U Anya
(74) *Attorney, Agent, or Firm* — Posz Law Group, PLC

(57) ABSTRACT

All of intervals between adjacent p type guard rings are set to be equal to or less than an interval between p type deep layers. As a result, the interval between the p type guard rings becomes large, i.e., the trenches are formed sparsely, so that the p type layer is prevented from being formed thick at the guard ring portion when the p type layer is epitaxially grown. Therefore, by removing the p type layer in the cell portion at the time of the etch back process, it is possible to remove the p type layer without leaving any residue in the guard ring portion. Therefore, when forming the p type deep layer, the p type guard ring and the p type connection layer (Continued)

by etching back the p type layer, the residue of the p type layer is restricted from remaining in the guard ring portion.

9 Claims, 13 Drawing Sheets

(51) Int. Cl.
    *H01L 21/04* (2006.01)
    *H01L 21/761* (2006.01)
    *H01L 29/06* (2006.01)
    *H01L 29/10* (2006.01)
    *H01L 29/16* (2006.01)
    *H01L 29/66* (2006.01)
    *H01L 29/739* (2006.01)

(52) U.S. Cl.
    CPC ........ *H01L 21/049* (2013.01); *H01L 21/0475* (2013.01); *H01L 21/0485* (2013.01); *H01L 21/0495* (2013.01); *H01L 21/761* (2013.01); *H01L 29/0623* (2013.01); *H01L 29/0696* (2013.01); *H01L 29/1095* (2013.01); *H01L 29/1608* (2013.01); *H01L 29/66068* (2013.01); *H01L 29/7806* (2013.01); *H01L 29/7813* (2013.01); *H01L 29/7397* (2013.01)

(58) Field of Classification Search
    USPC .......................................................... 257/77
    See application file for complete search history.

(56) References Cited

U.S. PATENT DOCUMENTS

| | | |
|---|---|---|
| 2011/0309464 A1 | 12/2011 | Yamamoto et al. |
| 2012/0098064 A1* | 4/2012 | Onishi ................ H01L 29/0619 257/341 |
| 2012/0126328 A1 | 5/2012 | Lin |
| 2015/0115286 A1 | 4/2015 | Takeuchi et al. |
| 2016/0104794 A1 | 4/2016 | Takeuchi et al. |
| 2018/0151366 A1* | 5/2018 | Endo ................... H01L 29/0843 |

* cited by examiner

SILICON CARBIDE SEMICONDUCTOR DEVICE AND MANUFACTURING METHOD THEREFOR

CROSS REFERENCE TO RELATED APPLICATIONS

This application is a U.S. national phase of International Application No. PCT/JP2017/023988 filed on Jun. 29, 2017 and is based on Japanese Patent Application No. 2016-133675 filed on Jul. 5, 2016, the disclosure of which is incorporated herein by reference.

TECHNICAL FIELD

The present disclosure relates to a silicon carbide (hereinafter referred to as SiC) semiconductor device having a deep layer and a guard ring layer and a method of manufacturing the same.

BACKGROUND

Conventionally, SiC has attracted attention as a material of power devices that can obtain high electric field breakdown strength. As a power device of SiC, for example, a MOSFET, a Schottky diode and the like have been proposed (see, for example, Patent Literature 1).

A power device made of SiC includes a cell portion in which a power element such as a MOSFET or a Schottky diode is formed and a guard ring portion surrounding the periphery of the cell portion. Between the cell portion and the guard ring portion, a connection portion for connecting these portions is arranged. Then, in the outer peripheral region including the guard ring portion, by hollowing the surface of the semiconductor substrate to form a concave portion, a mesa portion provided by protruding the connection portion and the cell portion with an island shape in the thickness direction of the substrate.

PRIOR ART LITERATURES

Patent Literature

Patent Literature 1: JP 2011-101036-A

SUMMARY

In the case where the concave portion is formed in the outer peripheral region including the guard ring portion, the connection portion is arranged between the cell portion and the guard ring portion, and the mesa portion is formed by protruding the cell portion and the connection portion in an island shape as described above, it is confirmed that the withstand voltage required for the power device may not be obtained.

It is an object of the present disclosure to provide a SiC semiconductor device including a semiconductor element for securing a withstand voltage and a manufacturing method thereof.

According to an aspect of the present disclosure, a SiC semiconductor device includes a substrate with a first or second conductivity type and a drift layer with a first conductivity type arranged on the front surface side of the substrate and having a lower impurity concentration than the substrate. In addition to the cell portion, an outer peripheral portion is formed such that the outer peripheral portion includes a guard ring portion surrounding the outer periphery of the cell portion and a connection portion located between the guard ring portion and the cell portion. In the cell portion or the cell portion and the connection portion, a second conductivity type layer is arranged such that the second conductivity type layer is disposed in a plurality of line-shaped first trenches formed in the drift layer with a stripe shape, and is made of an epitaxial film having the second conductivity type. Further, in the cell portion, a vertical type semiconductor device for flowing current between a first electrode and a second electrode is arranged, and includes the first electrode electrically connected to the second conductivity type layer and the second electrode formed on the back side of the substrate. The guard ring portion or the guard ring portion and the connecting portion includes a second conductivity type ring, which is disposed in a line-shaped second trench formed from the surface of the drift layer and has a plurality of frame shapes surrounding the cell portion, and is made of an epitaxial film. At least a part of the second conductive type ring located on the outer peripheral side functions as a guard ring provided in the guard ring portion so that the distance between the adjacent guard rings increases toward the outer periphery of the cell portion. The largest distance among the distances between adjacent guard rings is set to be equal to or smaller than the distance between adjacent deep layers.

In this manner, the distance between adjacent guard rings is set to be equal to or smaller than the distance between the second conductive type layers. Therefore, it is possible to suppress that the second conductivity type layer is formed to be thick in the guard ring portion by increasing the distance between the guard rings, that is, by sparsely forming the trenches. Therefore, by removing the second conductivity type layer in the cell portion when performing an etch back process, it becomes possible to remove the second conductivity type layer without leaving any residue in the guard ring portion. Therefore, when the second conductivity type layer is etched back, it is possible to suppress the residue of the second conductivity type layer from remaining in the guard ring portion. This makes it possible to obtain a SiC semiconductor device including a semiconductor element capable of securing the withstand voltage.

EMBODIMENTS

Figure 1:
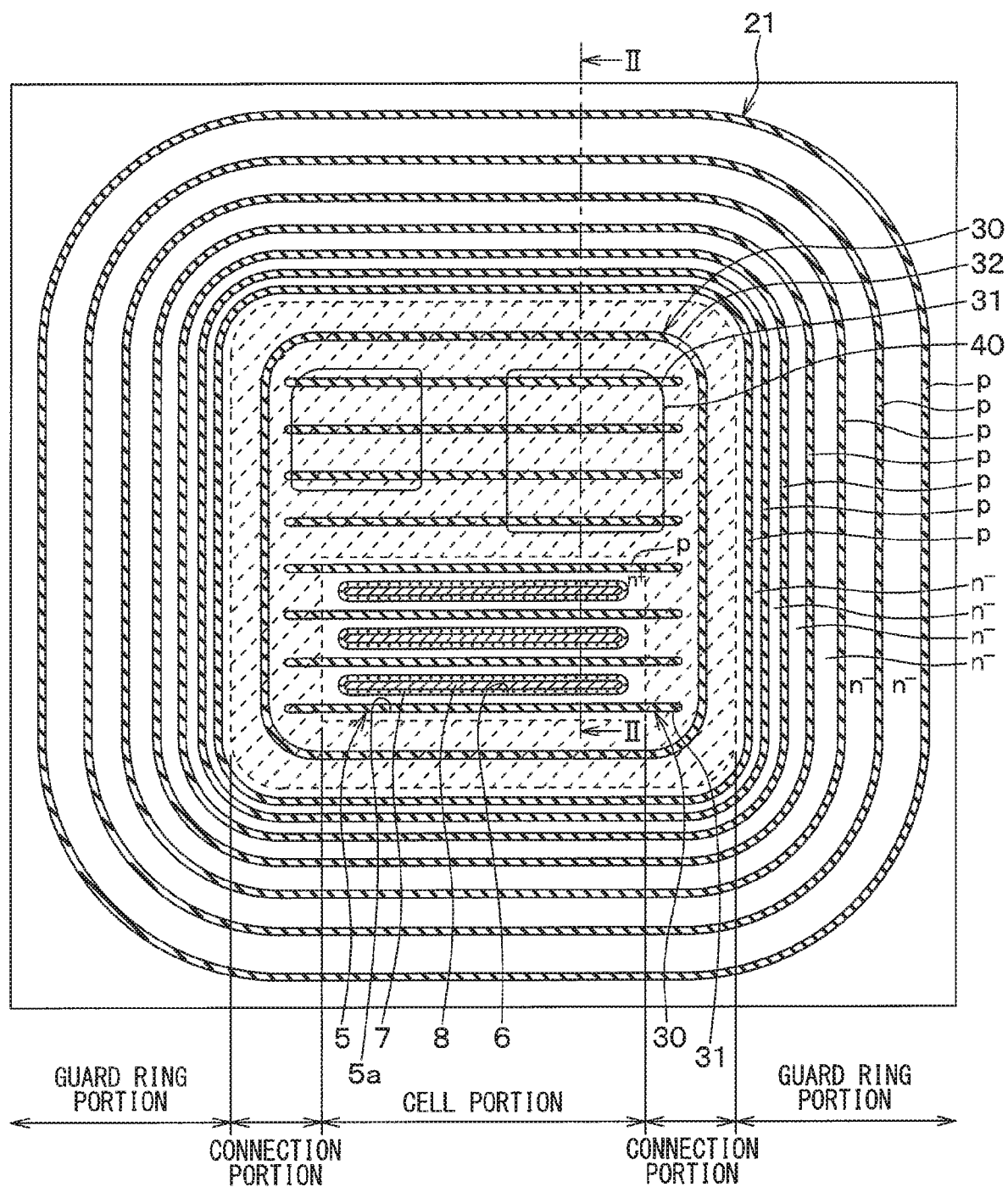
FIG. 1 is a diagram schematically showing a top layout of a SiC semiconductor device according to a first embodiment.

Embodiments of the present disclosure will be described below with reference to the drawings. In each embodiment described below, same or equivalent parts are designated with the same reference numerals.

First Embodiment

A first embodiment will be described. Here, an SiC semiconductor device in which an inversion type MOSFET having a trench gate structure is formed as a power element formed of a semiconductor element will be described as an example.

The SiC semiconductor device shown in FIG. 1 has a cell portion in which a MOSFET having a trench gate structure is formed, and an outer peripheral portion surrounding the cell portion. The outer peripheral portion has a guard ring portion and a connection portion disposed inside the guard ring portion, that is, between the cell portion and the guard ring portion. Although FIG. 1 is not a cross-sectional view, hatching is partially shown in order to make the figure easy understandable.

Figure 2:
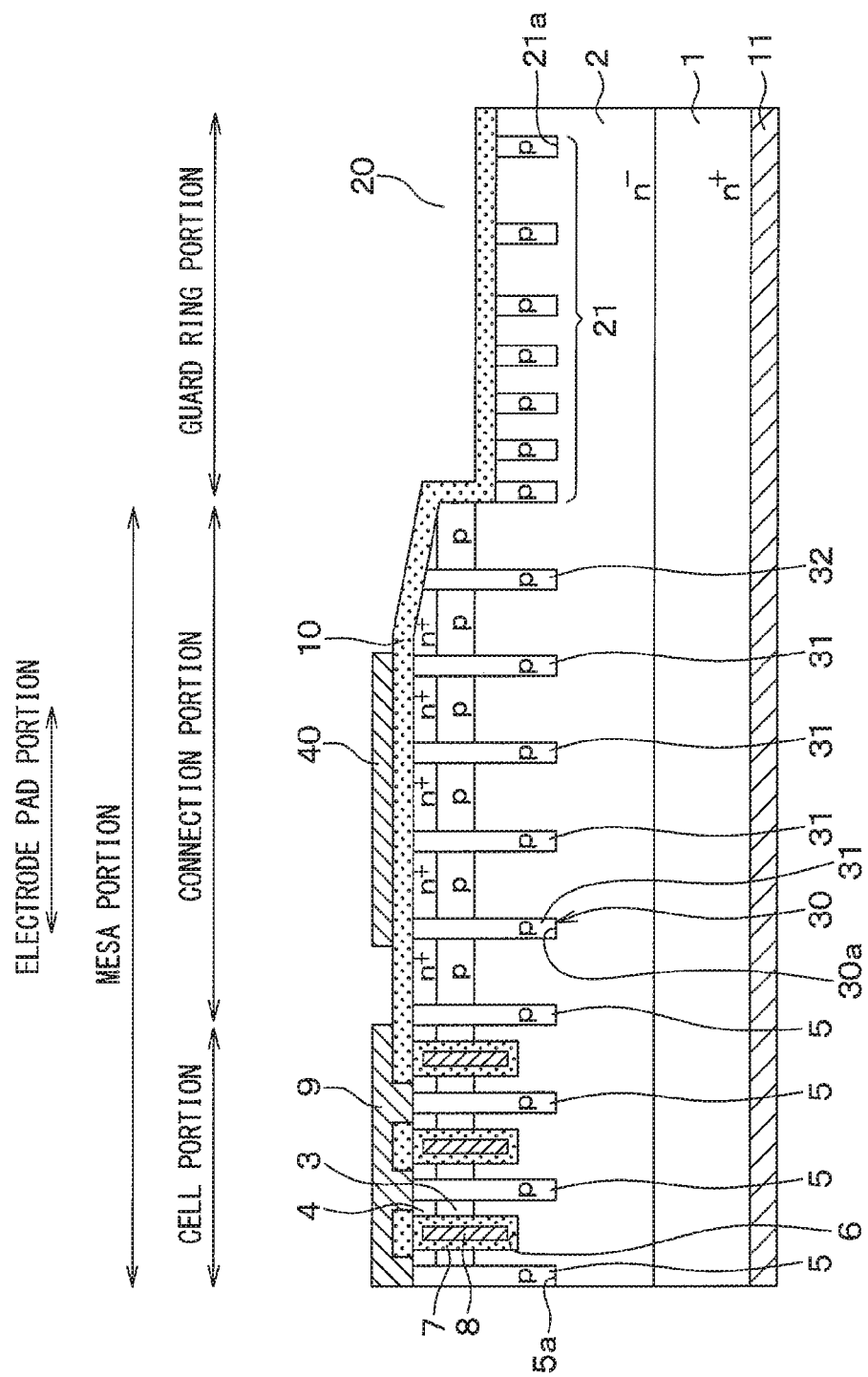
FIG. 2 is a diagram showing a cross-sectional view taken along line II-II of FIG. 1.

As shown in FIG. 2, the SiC semiconductor device is formed using an $n^+$ type substrate 1 made of SiC. On the main surface of the $n^+$ type substrate 1, an $n^-$ type drift layer 2, a p type base region 3, and the $n^+$ type source region 4 are made of SIC and are sequentially epitaxially grown.

For example, the $n^+$ type substrate 1 has an n type impurity concentration of $1.0 \times 10^{19}/cm^3$, and its surface is a (0001) Si plane. The $n^-$ type drift layer 2 has, for example, an n type impurity concentration of $0.5 \times 10^{16}/cm^3$ to $2.0 \times 10^{16}/cm^3$.

Further, the p-type base region 3 has a portion where a channel region is formed, and the portion has the p-type impurity concentration of, for example, about $2.0 \times 10^{17}/cm^3$ and the thickness of 300 nm. The $n^+$ type source region 4 has a higher impurity concentration than the $n^-$ type drift layer 2, and has the n type impurity concentration in the surface portion of, for example, $2.5 \times 10^{18}/cm^3$ to $1.0 \times 10^{19}/cm^3$, and the thickness of about 0.5 μm.

In the cell portion, the p type base region 3 and the $n^+$ type source region 4 are left on the surface side of the $n^+$ type substrate 1, and in the guard ring portion, the concave portion 20 is formed to penetrate the $n^+$ type source region 4 and the p type base region 3 and to reach the $n^-$ type drift layer 2. By adopting such a structure, a mesa structure is formed.

In the cell portion, a p type deep layer 5 is formed so as to penetrate the $n^+$ type source region 4 and the p type base region 3 and to reach the $n^-$ type drift layer 2. The p type deep layer 5 has a higher p type impurity concentration than the p type base region 3. More specifically, a plurality of p type deep layers 5 are arranged at equal intervals at least in the $n^-$ type drift layer 2, and as shown in FIG. 1, the p type deep layers 5 are arranged in the stripe-shaped trenches $5a$ which are separated from each other without intersecting each other, and is made of a p type epitaxial film in an epitaxial growth process. The trench $5a$ corresponds to a deep trench, and has a depth of, for example, 1 micrometer or less and an aspect ratio of 2 or more. The p-type deep layer 5 shown in FIG. 1, the trench gate structure and the connection layer 30 which will be described later and the like are actually provided in the illustrated number or more, but for simplicity, the number is reduced and described.

For example, each p type deep layer 5 has a p type impurity concentration of, for example, $1.0 \times 10^{17}/cm^3$ to $1.0 \times 10^{19}/cm^3$, a width of 0.7 micro-meters, and a depth of about 2.0 micro meters. The p type deep layer 5 is formed from one end to the other end of the cell portion as shown in FIG. 1. Further, the p type deep layer 5 extends along a longitudinal direction same as the extending direction of the trench gate structure to be described later, and is connected to a p type connection layer 30, which will be described later, extending further to the outside of the cell portion than both ends of the trench gate structure.

Although the extending direction of the p type deep layer 5 may be arbitrary, both walls of the trench $5a$, which face each other, provide a long side of the trench $5a$, and extend in the <11-20> direction, are the same (1-100) plane. Thus, the growth at the embedding and epitaxial growth process is homogeneous on both wall surfaces. Therefore, the film quality can be made uniform and the effect of suppressing the embedding failure can also be obtained.

A gate trench 6 having a width of 0.8 μm and a depth of 1.0 μm, for example, is formed so as to penetrate the p type base region 3 and the $n^+$ type source region 4 and to reach the n⁻ type drift layer 2. The above described p type base region 3 and n⁺ type source region 4 are arranged so as to be in contact with the side surface of the gate trench 6. The gate trench 6 is formed in a line-like layout in which the lateral direction of the drawing surface of FIG. 2 is the width direction, the direction perpendicular to the drawing surface is the longitudinal direction, and the vertical direction of the drawing surface is the depth direction. In addition, as shown in FIG. 1, a plurality of gate trenches 6 are arranged so as to be sandwiched between p type deep layers 5, respectively, and are arranged in a stripe shape manner in parallel to each other at equal intervals.

A portion of the p type base region 3 located on the side surface of the gate trench 6 functions as a channel region connecting between the n⁺ type source region 4 and the n⁻ type drift layer 2 during the operation of the vertical MOSFET. A gate insulation film 7 is formed on the inner wall surface of the gate trench 6 including the channel region. A gate electrode 8 made of doped Poly-Si is formed on the surface of the gate insulation film 7, and the inside of the gate trench 6 is filled with the gate insulation film 7 and the gate electrode 8.

On the surfaces of the n⁺ type source region 4 and the p type deep layer 5, and on the surface of the gate electrode 8, a source electrode 9 corresponding to the first electrode and a gate pad 40 arranged in an electrode pad portion are formed. The source electrode 9 and the gate pad 40 are made of a plurality of metals, for example, Ni/Al or the like. A portion of at least n type SiC among a plurality of metals, specifically, a portion in contact with the gate electrode 8 in the case of the n⁺ type source region 4 or the n type doping portion, is made of a metal capable of ohmic contact with the n type SiC. In addition, at least a portion of at least p type SiC among the plurality of metals, specifically, a portion in contact with the p type deep layer 5, is made of a metal capable of ohmic contact with the p type SiC. Here, the source electrode 9 and the gate pad 40 are formed on the interlayer insulation film 10 to be electrically insulated. Then, through the contact hole formed in the interlayer insulation film 10, the source electrode 9 is electrically connected to the n⁺ type source region 4 and the p type deep layer 5, and the gate pad 40 is electrically connected to the gate electrode 8.

Further, a drain electrode 11 corresponding to a second electrode electrically connected to the n⁺ type substrate 1 is formed on the back side of the n⁺ type substrate 1. With such a structure, an n channel inversion type trench gate structure MOSFET is provided. Then, a plurality of such MOSFETs are arranged in a plurality of cells respectively to form a cell portion.

On the other hand, in the guard ring portion, as described above, the concave portion 20 is formed so as to penetrate the n⁺ type source region 4 and the p type base region 3 and to reach the n⁻ type drift layer 2. Therefore, the n⁺ type source region 4 and the p type base region 3 are removed at a position distant from the cell portion, and the n⁻ type drift layer 2 is exposed. In the thickness direction of the n+ type substrate 1, a cell portion and a connecting portion located inside the concave portion 20 are mesa portions protruding like islands.

A plurality of p type guard rings 21 are arranged on the surface layer portion of the n⁻ type drift layer 2 located below the concave portion 20 so as to surround the cell portion. In FIG. 1, seven p type guard rings 21 are shown. In the case of the present embodiment, the p type guard ring 21 has a quadrangular shape in which the four corners are rounded. Alternatively, the ring 21 may have another frame shape such as a circular shape. The p type guard ring 21 is disposed in the trench 21a, which penetrates the n⁺ type source region 4 and the p type base region 3 and reaches the n⁻ type drift layer 2, and is made of a p type epitaxial film by epitaxial growth. The trench 21a corresponds to a guard ring trench, and has a depth of, for example, 1 micrometer or less and an aspect ratio of 2 or more.

In the present embodiment, the p type guard ring 21 has a quadrangular shape with four corners rounded. Each part constituting the p type guard ring 21 has the same structure as the above described p type deep layer 5. The p type guard ring 21 is different from the p type deep layer 5 formed in a straight line shape about a feature such that the top surface shape a line shape having a frame surrounding the cell portion and the connection portion. But the other features are similar. Thus, the p type guard ring 21 has the same width and the same thickness as the p type deep layer 5, that is, the same depth. The intervals between the p type guard rings 21 may be equal to each other. Alternatively, the intervals between the guard rings 21 may be narrower at the side of the cell portion and wider toward the outer peripheral side, so that the electric field concentration is relaxed more on the inner circumferential side, that is, on the cell portion side, and the equipotential line directs to more outer peripheral side. All of the distances between the adjacent p type guard rings 21 are set to be equal to or less than the intervals between the p type deep layers 5. In other words, the interval between the outermost one of the p type guard rings 21 and the one located inside the outermost one of the p type guard rings 21 is set to be equal to or less than the interval between the p type deep layers 5, and the intervals between others of the p type guard rings inside the one located inside the outermost one is set to be smaller than the interval between the p type deep layers 5.

Although not shown, the EQR structure is arranged on the outer periphery of the p type guard ring 21 as necessary, so that a guard ring portion having an outer peripheral withstand voltage structure surrounding the cell portion is provided.

Furthermore, as shown by a hatching broken line in FIG. 1, a p type connection layer 30 is formed in the surface layer portion of the n⁻ type drift layer 2 in the connection portion as a connecting part between the cell portion and the guard ring portion. In the case of this embodiment, as shown in FIG. 1, a connecting part is formed so as to surround the cell portion, and a plurality of p type guard rings 21 are formed so as to surround the outside of the connecting part.

The p type connection layer 30 is formed in such a manner as to include a linear portion 31 arranged in a stripe shape by arranging a plurality of the linear portions 31 in parallel to the p type deep layer 5 formed in the cell portion, and a frame portion 32 formed by arranging one or a plurality of the frame portions 32 to surround the p type deep layer 5 and the linear portion 31. The linear portion 31 is formed between the cell portion and the frame portion 32 so as not to generate a place where the equipotential line rises excessively in the region between the cell portion and the frame portion 32 since the p type layer is not formed in the n⁻ type drift layer 2. A plurality of linear portions 31 are arranged in parallel with the p type deep layer 5 between the cell portion and the frame portion 32 in the direction perpendicular to the longitudinal direction of the p type deep layer 5. Between the cell portion in the longitudinal direction of the p type deep layer 5 and the frame portion 32, the linear portion 31 is formed so as to be connected to the tip of the p type deep layer 5. As described above, the linear portion 31 is disposed between the cell portion and the frame portion 32, and the distance between the linear portion 31 and the frame portion 32 is equal to or smaller than the distance between the p type deep layers 5.

Each p type connection layer 30 is disposed in the trench 30a, which penetrates the n$^+$ type source region 4 and the p type base region 3 and reaches the n$^-$ type drift layer 2, and is made of a p type epitaxial film by epitaxial growth. The trench 30a corresponds to a connection trench, and has a depth of, for example, 1 micrometer or less and an aspect ratio of 2 or more. Since the p type connection layer 30 is in contact with the p type base region 3, the potential of the p type connection layer 30 is fixed at the source potential.

In the case of this embodiment, the linear portion 31 of the p type connection layer 30 has the same width as the p type deep layer 5, and the interval between the linear portions 31 is the same as the interval between the p type deep layers 5. The width of the frame portion 32 is the same as that of the p type deep layer 5. In addition, the interval between the frame portion 32 and the p type guard ring 21 is set to be equal to or less than the interval between the p type deep layers 5. In FIG. 1, only one frame portion 32 is shown, but a plurality of frame portions 32 may be provided. In this case, the interval between the frame portions 32 is set to be equal to or less than the interval between the p type deep layers 5.

Although the frame portion 32 has been described in distinction from the p type guard ring 21, the frame portion 32 and the p-type guard ring 21 may constitute a concentric p type ring having a plurality of frame shapes. In other words, it can be said that the portion of the p type ring disposed radially inward of the concave portion 20 constitutes the frame portion 32, and the portion formed in the concave portion 20 constitutes the p type guard ring 21. In this case, all of the distances between the p type rings are set to be equal to or less than the interval between the p type deep layers 5. For example, it is possible to form a layout in which the distance between adjacent p type rings increases toward the outer circumference side from the inner circumference side. Even in such a case, the distance between the outermost circumference one and the one inside the outermost circumference one is equal to or smaller than the distance between the p type deep layers 5.

By forming such a p type connection layer 30 and setting the distance between the p type connection layers 30 to a predetermined interval, for example, at a smaller interval than the p type deep layer 5, or at equal intervals, it is possible to suppress the equipotential line from excessively rising up between the p type connection layers 30. Thereby, it is possible to suppress the formation of a portion where the electric field concentration occurs between the p type connection layers 30, and it is possible to suppress the reduction in breakdown voltage.

Here, the shape of the upper surface of the linear portion 31 is semicircular at both ends of each linear portion 31 in the longitudinal direction, that is, at both ends of the trench 30a in which the linear portion 31 is formed. The shape of the upper surface at both ends of the trench 30a may be a quadrangular shape. Alternatively, n type layer may be firstly formed at the corner portion, so that the conductive type becomes the n type. Therefore, by making the shape of the upper surface at both ends of each linear portion 31 semicircular, it is possible to eliminate the portion where the n type layer is formed.

Also in the connection portion, the interlayer insulating film 10 is formed on the surface of the n$^+$ type source region 4. The gate pad 40 described above is formed on the interlayer insulation film 10 at the connection portion.

In this way, since the connection portion is arranged between the cell portion and the guard ring portion, and the connection portion is constituted by the plurality of p type connection layers 30 buried in the narrow trench 30a, the thickness of the p type connection layer 30 is not reduced and the p type connection layer 30 is not eliminated. On the other hand, since the p type connection layer 30 is divided into a plurality of parts, there is a possibility that equipotential lines will rise up between the p type connection layers 30. However, by setting the interval between the p type connection layers 30 to be equal to or smaller than the above-mentioned interval, for example, to be the same interval as or smaller than the interval between the p type deep layers 5, the excessive rising of the equipotential lines can be suppressed, and it is possible to suppress a decrease in breakdown voltage.

With the above structure, the SiC semiconductor device according to the present embodiment is configured. In the SiC semiconductor device configured as described above, when the MOSFET turns on, by controlling the voltage applied to the gate electrode 8, a channel region is formed in the surface portion of the p type base region 3 located on the side surface of the gate trench 6. Thus, a current flows between the source electrode 9 and the drain electrode 11 via the n$^+$ type source region 4 and the n type drift layer 2.

In addition, even when a high voltage is applied at the time the MOSFET turns off, since the p type deep layer 5 is formed to a deeper position than the trench gate structure, entry of an electric field to the bottom of the gate trench is suppressed by the p type deep layer 5, so that the electric field concentration at the bottom of the gate trench is reduced. As a result, breakdown of the gate insulation film 7 is prevented.

In the connection portion, the rising of the equipotential line is suppressed, and the equipotential line is directed toward the guard ring portion side.

Further, in the guard ring portion, the p type guard ring 21 terminates the interval between the equipotential lines while expanding the interval toward the outer circumference direction, so that a required withstand voltage can be obtained even in the guard ring portion. Therefore, a SiC semiconductor device capable of obtaining a required breakdown voltage can be obtained.

Subsequently, a method of manufacturing the SiC semiconductor device according to this embodiment will be described with reference to FIG. 3A and FIG. 3H.

Figure 3A:
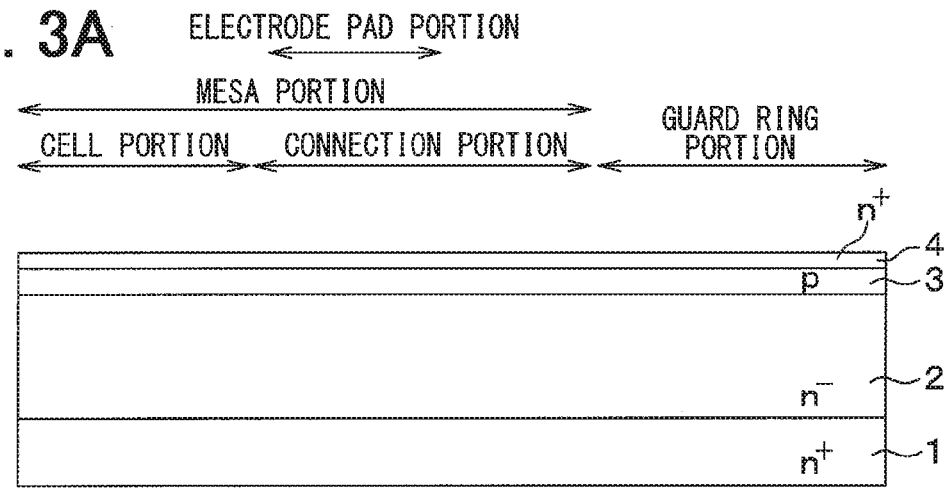
FIG. 3A is a cross-sectional view showing a manufacturing process of a SiC semiconductor device according to the first embodiment.

[Process Shown in FIG. 3A]

First, an n$^+$ type substrate 1 is prepared as a semiconductor substrate. Then, an n$^-$ type drift layer 2, a p type base region 3 and an n$^+$ type source region 4 made of SiC are epitaxially grown in this order on the main surface of the n$^+$ type substrate 1.

Figure 3B:
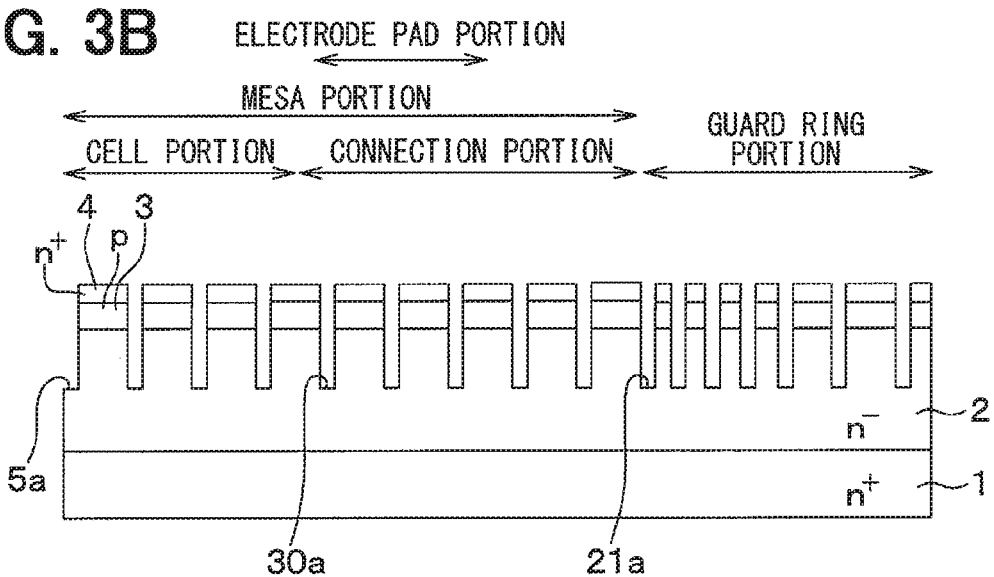
FIG. 3B is a cross-sectional view showing a manufacturing process of the SiC semiconductor device continued from FIG. 3A.

[Process Shown in FIG. 3B]

Next, a mask not shown is placed on the surface of the n$^+$ type source region 4, and regions of the mask, where the p type deep layer 5, the p type guard ring 21 and the p type connection layer 30 are to be formed, are opened. Then, anisotropic etching process such as RIE (Reactive Ion Etching) or the like is performed using a mask to form the trenches 5a, 21a, and 30a. As a result, the trenches 5a, 21a and 30a are formed at desired intervals.

Figure 3C:
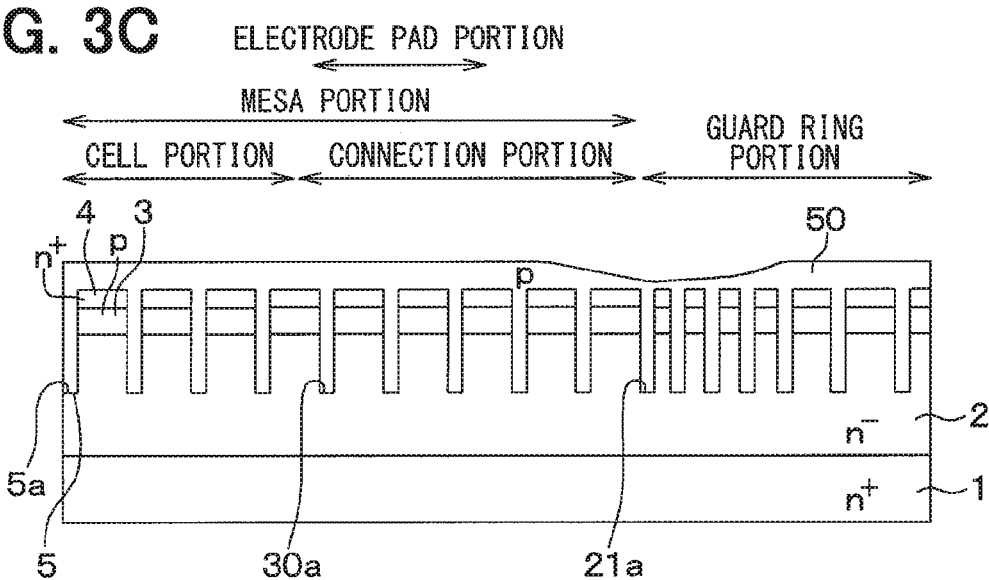
FIG. 3C is a cross-sectional view showing a manufacturing process of the SiC semiconductor device continued from FIG. 3B.

[Process Shown in FIG. 3C]

After removing the mask, the p type layer 50 is formed. At this time, the p type layer 50 is embedded in the trenches 5a, 21a, 30a by the embedding epitaxial process. Since the trenches 5a, 21a, 30a are formed with the same width, the trenches 5a, 21a 30a are surely filled with the p type layer 50.

However, since the trench formation area per unit area is different at the position where each of the trenches 5a, 21a, 30a is formed, the thickness of the p type layer 50 on the n+ type source region 4 is different, and convexities and concavities are formed on the surface of the p type layer 50. Specifically, in the cell portion where the trench 5a is formed at relatively large intervals, the p type layer 50 is thick. The p type layer 50 formed from the connection portion, where the trenches 21a and 30a are formed at a relatively small interval, to the guard ring portion becomes thin. In the case where the interval between the trenches 30a in the connection portion is made equal to the interval between the trenches 5a in the cell portion as in the present embodiment, the surface of the p type layer 50 is flat in the cell portion and the connection portion. In the guard ring portion, where the trench 21a is formed to set the interval therebetween to be equal to or less than the interval between the trenches 5a, the p type layer 50 becomes thinner than the cell portion.

Figure 3D:
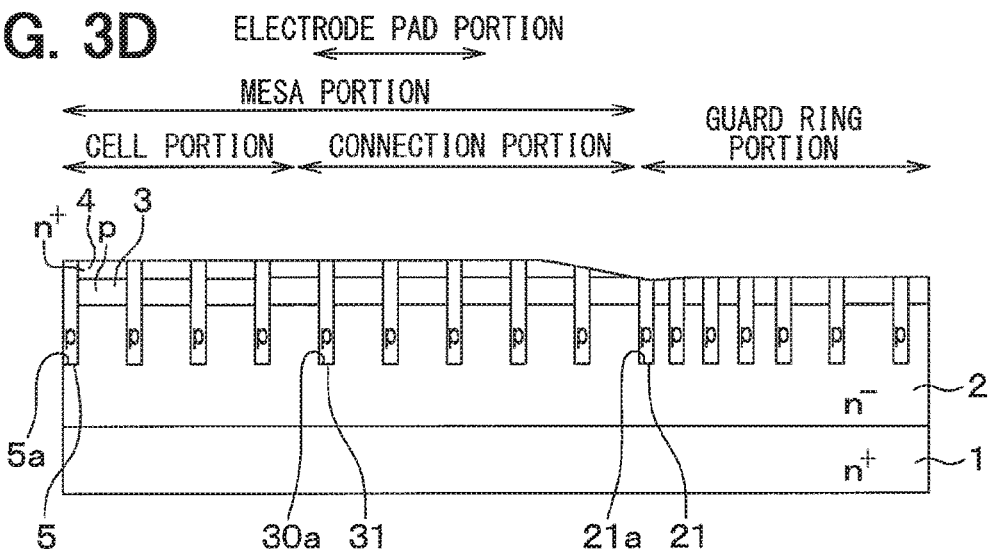
FIG. 3D is a cross-sectional view showing a manufacturing process of the SiC semiconductor device continued from FIG. 3C.

[Process Shown in FIG. 3D]

An etch back process is performed by the dry etching method to remove a part of the p type layer 50 formed above the surface of the n+ type source region 4. Thereby, the p type deep layer 5, the p type guard ring 21 and the p type connection layer 30 are formed.

Here, as described above, the interval between the adjacent p type guard rings 21 is set to be equal to or less than the interval between the p type deep layers 5. For this reason, it is suppressed that the p type layer 50 is thickly formed in the guard ring portion by increasing the distance between the p type guard rings 21, that is, by sparsely forming the trenches 21. Therefore, the thickness of the p type layer 50 is the thickest in the cell portion, and in the guard ring portion and the connecting portion, the thickness of the layer 50 is less than or equal to that in the cell portion. When the p type layer 50 of the cell portion is removed at the time of etch back process, it is possible to remove the p type layer 50 without leaving a residue in the guard ring portion. Therefore, when forming the p type deep layer 5, the p type guard ring 21 and the p type connection layer 30 by etching back the p type layer 50, it is suppressed that the p type layer 50 remains as a residue in the guard ring portion.

Figure 3E:
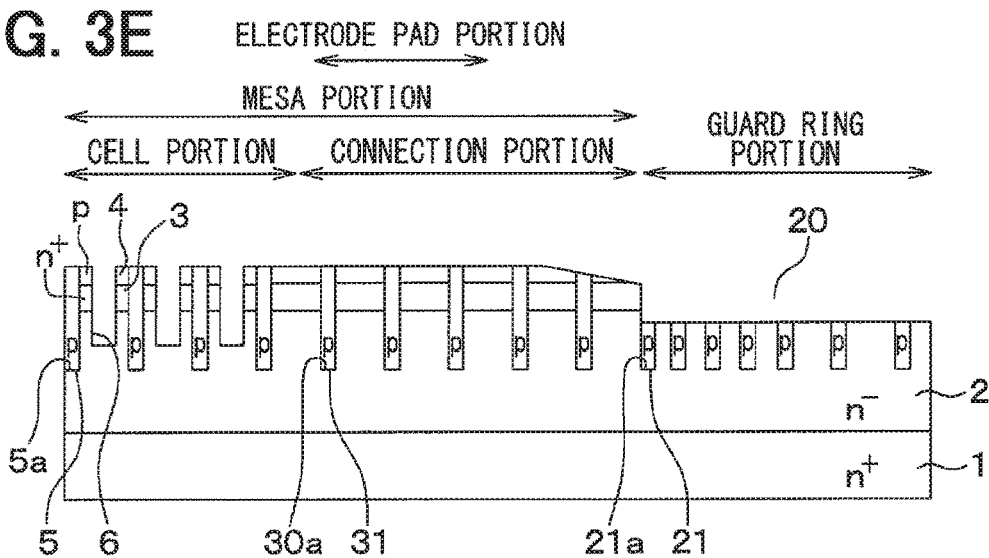
FIG. 3E is a cross-sectional view showing a manufacturing process of the SiC semiconductor device continued from FIG. 3D.

[Process Shown in FIG. 3E]

A mask not shown is formed on the n+ type source region 4 and the like, and then a region of the mask where the gate trench 6 is to be formed is opened. Then, the gate trench 6 is formed by performing anisotropic etching process such as RIE using a mask.

Further, after removing the mask, a mask not shown is formed again, and an area of the mask in which the concave portion 20 is to be formed is opened. Then, the concave portion 20 is formed by performing an anisotropic etching process such as RIE using a mask. As a result, the n− type drift layer 2 is exposed through the n+ type source region 4 and the p type base region 3 at the position where the concave portion 20 is formed, and a plurality of the p type guard rings 21 are arranged on the surface portion of the n− type drift layer 2.

Here, the concave portion 20 of the gate trench 6 is formed in a separate process using different masks. Alternatively, the concave portion 20 may be formed simultaneously using the same mask. In practice, the height of the bottom surface of the concave portion 20 may be varied according to the distance between the trenches 21a. The feature is simplified in the drawing.

Figure 3F:
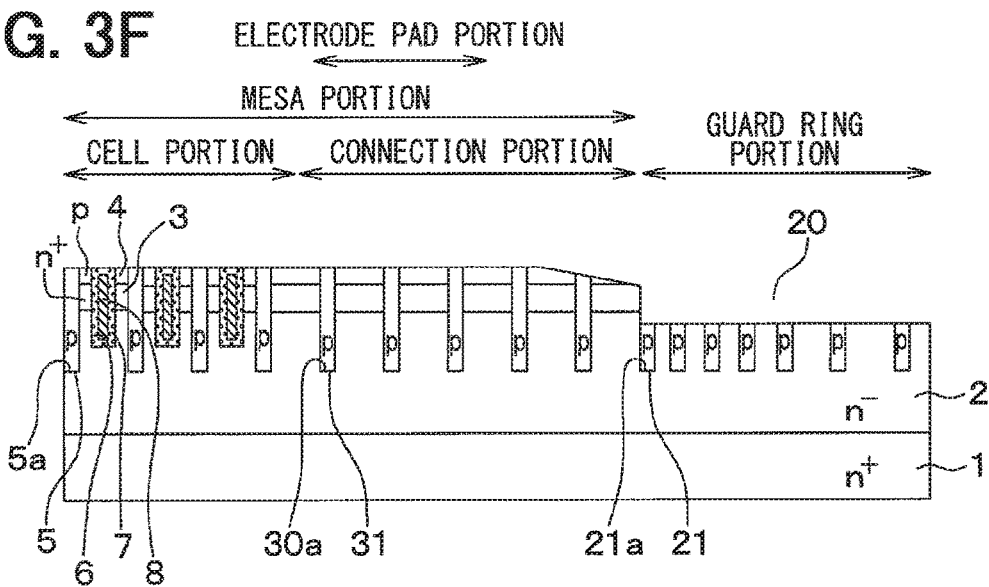
FIG. 3F is a cross-sectional view showing a manufacturing process of the SiC semiconductor device continued from FIG. 3E.

[Process Shown in FIG. 3F]

After removing the mask, for example, thermal oxidation is performed to form the gate insulation film 7, and the gate insulation film 7 covers the inner wall surface of the gate trench 6 and the surface of the n+ type source region 4. Then, after depositing Poly-Si doped with a p type impurity or an n type impurity, the Poly-Si material is etched back to leave the Poly-Si material in at least the gate trench 6, thereby forming the gate electrode 8.

Figure 3G:
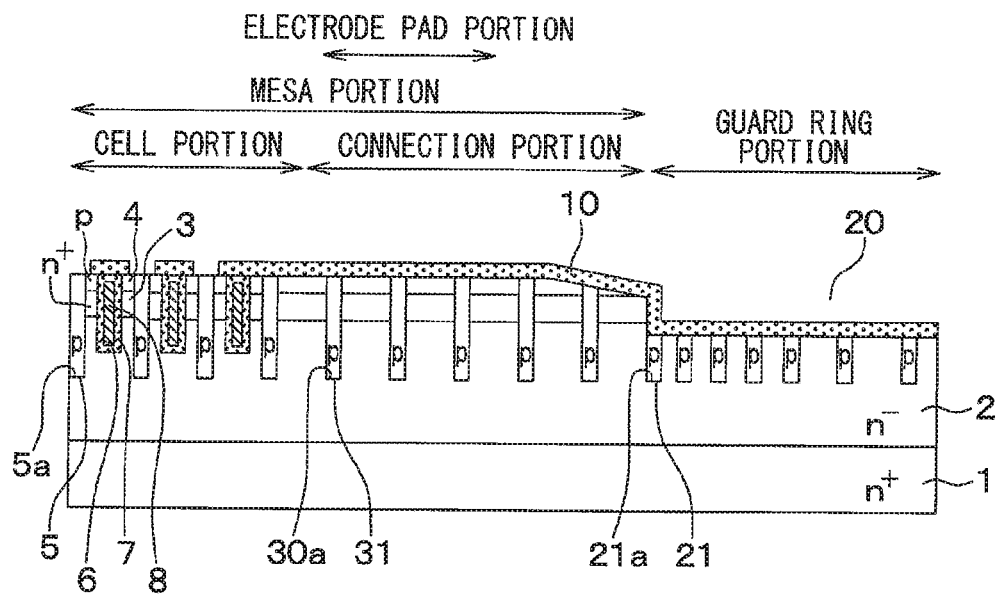
FIG. 3G is a cross-sectional view showing a manufacturing process of the SiC semiconductor device continued from FIG. 3F.

[Process Shown in FIG. 3G]

An interlayer insulation film 10 made of, for example, an oxide film or the like is formed so as to cover the surfaces of the gate electrode 8 and the gate insulation film 7. Then, after forming a mask not shown on the surface of the interlayer insulation film 10, a portion of the mask located between the gate electrodes 8, that is, a portion corresponding to the p type deep layer 5 and their vicinity is opened. Thereafter, a contact hole for exposing the p type deep layer 5 and the n+ type source region 4 is formed by patterning the interlayer insulation film 10 using a mask.

Figure 3H:
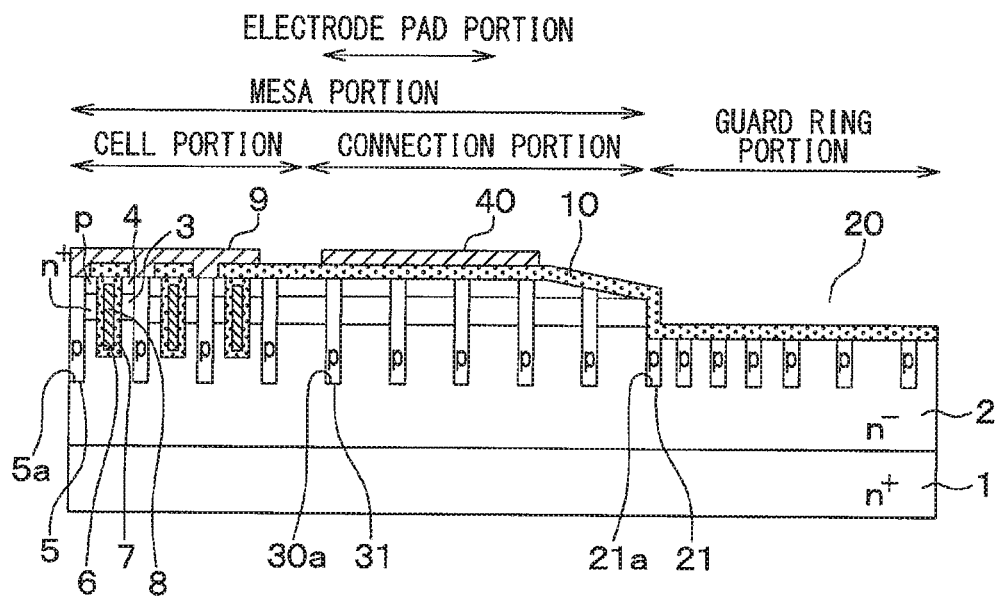
FIG. 3H is a cross-sectional view showing a manufacturing process of the SiC semiconductor device continued from FIG. 3G.

[Step Shown in FIG. 3H]

An electrode material constituted by, for example, a laminated structure of a plurality of metals is formed on the surface of the interlayer insulation film 10. Then, by patterning the electrode material, the source electrode 9 and the gate pad 40 are formed. Here, a gate lead-out portion connected to the gate electrode 8 of each cell is arranged in a cross section different from that in this drawing. A contact hole is formed in the interlayer insulation film 10 at the lead-out portion, so that the gate pad 40 and the gate electrode 8 are electrically connected.

Although not shown in the following process, the SiC semiconductor device according to the present embodiment is completed by performing a process such as forming the drain electrode 11 on the back side of the n+ type substrate 1.

Subsequently, effects of the SiC semiconductor device and the manufacturing method thereof according to the present embodiment will be described.

Before describing the effect, a consideration and the like of the present inventors up to the SiC semiconductor device and the manufacturing method thereof according to this embodiment will be described.

Figure 4:
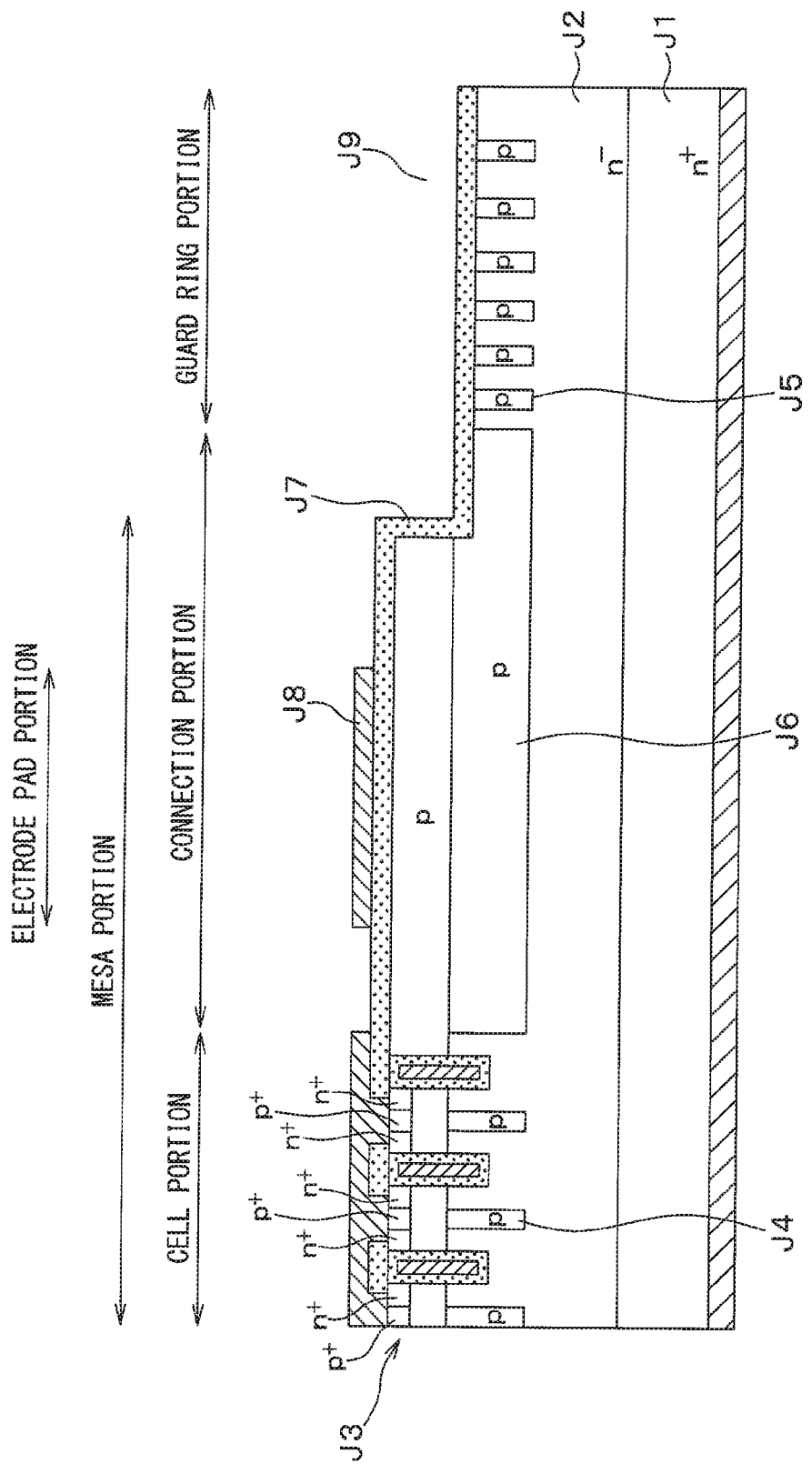
FIG. 4 is a cross-sectional view of a SiC semiconductor device studied by the present inventors.

First, the inventors of the present disclosure consider a structure such that the connection portion is arranged between the cell portion and the guard ring portion, and the concave portion is formed in an outer peripheral region including the guard ring portion, and the mesa portion is provided by protruding the cell portion and the connection portion with an island shape. For example, the structure shown in FIG. 4 is considered.

As shown in the drawing, using a semiconductor substrate in which an n− type drift layer J2 is formed on an n+ type SiC substrate J1, a cell portion, in which a power element J3 constituted by a MOSFET or the like is formed, and a guard ring portion are formed. A plurality of p type deep layers J4 for improving the withstand voltage of the power device J3 are formed in a stripe shape in the cell portion, and a p type guard ring J5 constituted by a p type layer is formed in the guard ring portion with a frame shape. Then, a connection portion is arranged between the cell portion and the guard ring portion, and a p type connection layer J6 for electric field relaxation is formed in the connection portion so that the equipotential line does not terminate at the connection portion, and the electric field concentration is suppressed. Further, in this connection portion, an electrode pad portion, in which the electrode pad J8 is arranged on the interlayer insulation film J7 formed on the front surface side of the semiconductor substrate, is arranged, and at a desired portion of the power element J3, for example, an electric connection between the gate electrode and an external device is made.

Further, a concave portion J9 is formed in the guard ring portion so that the surface of the n⁻ type drift layer J 2 is exposed, and the interlayer insulation film J7 is formed thereon. In the thickness direction of the n⁺ type SiC substrate J1, a mesa portion is prepared by protruding the inner portion of the concave portion J9 from the guard ring portion.

In such a structure, with respect to the p type deep layer J4, the p type connection layer J6 and the p type guard ring J5, a p type impurity is ion implanted in the n⁻ type drift layer J2 so that they are formed.

However, SiC has a short implantation range in the ion implantation process, and therefore, it is difficult to perform the ion implantation to a deep position. In order to form the p type deep layer J4, the p type connection layer J6 and the p type guard ring J5 to a deep position, it is necessary to constitute these by an epitaxial film in the epitaxial growth process rather than the ion implantation process. That is, after embedding the epitaxial film in the trench, the epitaxial film outside the trench is removed by the etch back process to form the p type deep layer J4, the p type connection layer J6 and the p type guard ring J5.

However, in the case of using the epitaxial film, the width of the p type connection layer J6 is larger than the narrow width such as the p type deep layer J4 and the p type guard ring J5, so a difficulty arises such that the thickness of the p type connection layer J6 is thinner, and a region where the p type connection layer J6 is eliminated is formed. For this reason, it was impossible to obtain a withstand voltage required for a power device.

In order to prevent this difficulty, the present inventors investigate to construct the p type connection layer J6 without widening a width but with providing a narrow width having the same width as the p type deep layer J4 and the p type guard ring J5. In this way, when the width of the p type connection layer J6 is narrowed, it is possible to appropriately embed the epitaxial film in the trench for constructing the p type connection layer J6. In the guard ring portion, however, it is desirable to increase the interval of the p type guard rings J5 toward the outer periphery so that the electric field concentration is relaxed and the equipotential line is directed to the outer peripheral side of the cell portion. As for the p type connection layer J6, preferably, the interval between the p type connection layers J6 may be made narrower than the interval between the p type deep layers J4 and the interval between the p type guard rings J5 so that the effects of electric field relaxation can more reliably be accomplished.

However, when such a spacing design is carried out, it is confirmed that the film thickness may vary when the epitaxial film is formed to provide the p type deep layer J4, the p type connection layer J6 and the p type guard ring J5.

Figure 5A:
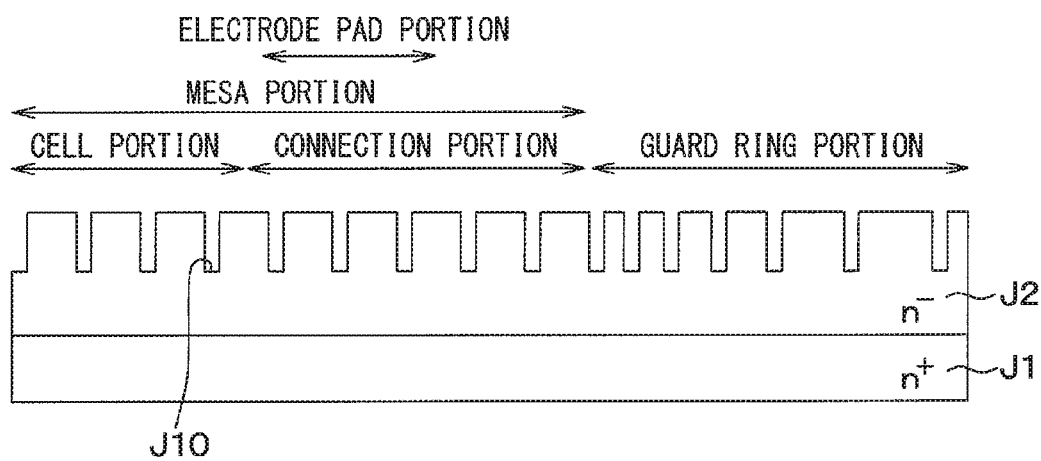
FIG. 5A is a cross-sectional view of a SiC semiconductor device during the manufacturing process, which the present inventors have studied.
Figure 5B:
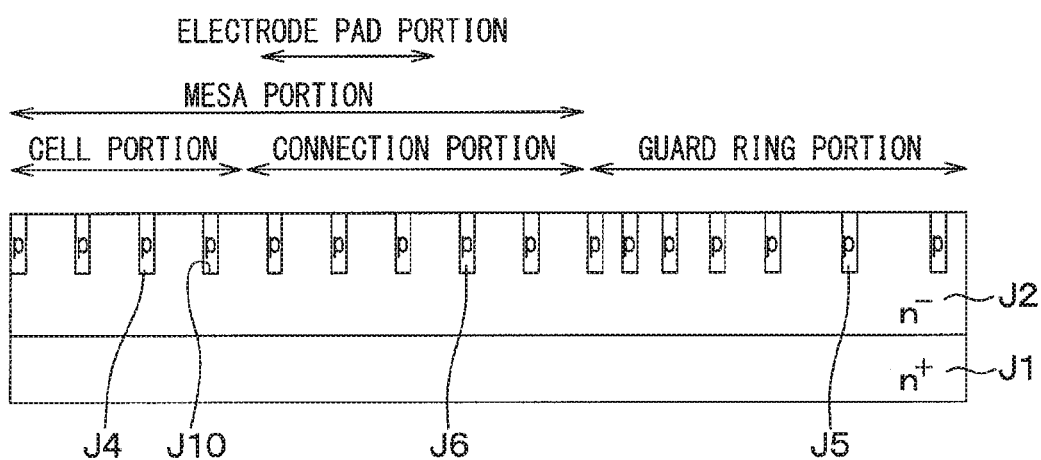
FIG. 5B is a cross-sectional view showing a manufacturing process of the SiC semiconductor device continued from FIG. 5A.

Specifically, first, as shown in FIG. 5A, a trench J10 is formed in the n⁻ type drift layer J2. Thereafter, the inside of the trench J10 is filled with an epitaxial film, and then the epitaxial film is etched back to form a p type deep layer J4, a p type connection layer J6 and a p type guard ring J5. Ideally, as shown in FIG. 5B, preferably, in addition to the n⁻ type drift layer J2, the surfaces of the p type deep layer J4, the p type connection layer J6 and the p type guard ring J5 are disposed on the same plane.

Figure 5C:
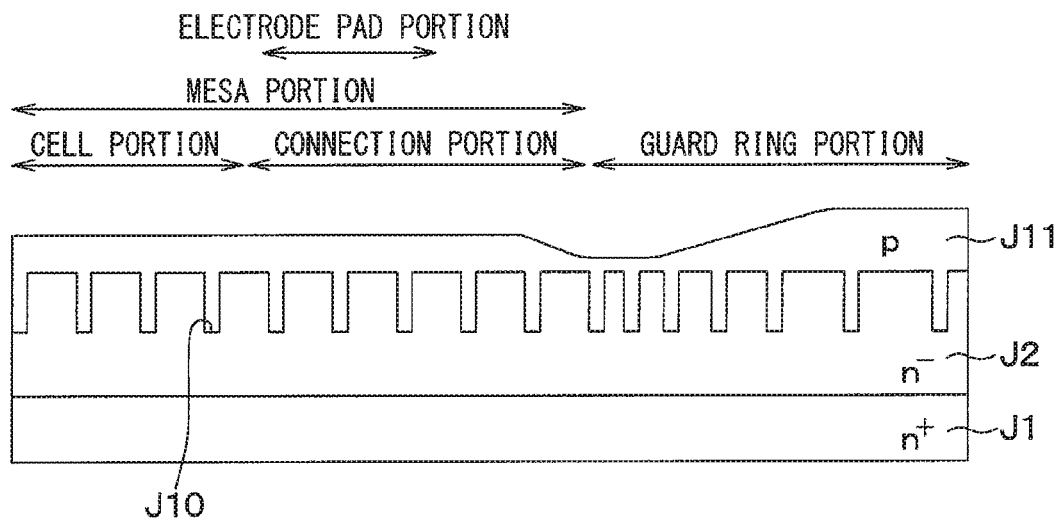
FIG. 5C is a cross-sectional view showing a manufacturing process of the SiC semiconductor device continued from FIG. 5B.
Figure 5D:
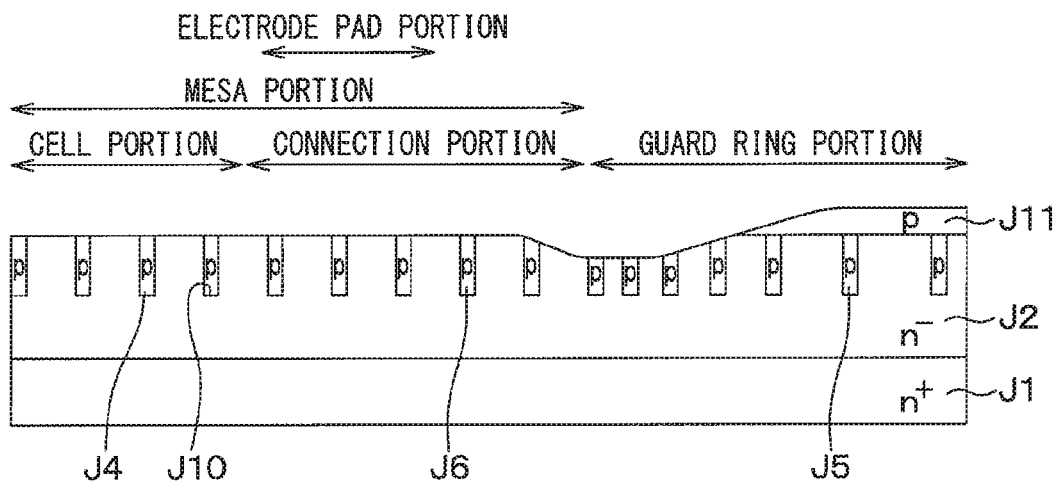
FIG. 5D is a cross-sectional view showing a manufacturing process of the SiC semiconductor device continued from FIG. 5C.

However, in the guard ring portion, when the interval of the p type guard ring J5 gradually increases toward the outer periphery, as shown in FIG. 5C, in the guard ring portion, the trench J10 becomes sparse and the film thickness of the epitaxial film J11 becomes larger than the other parts. Therefore, as shown in FIG. 5D, when the epitaxial film is etched back, the epitaxial film J11 may remain as residue in the guard ring portion. Therefore, the function as the guard ring portion cannot be obtained, and electric field relaxation cannot be performed, so that the device breakdown voltage may be reduced. If the amount of etch-back process is increased, the residue can be removed. In that case, the n⁻ type drift layer J2, the p type deep layer J4 and the p type connection layer J6 are thinned in the cell portion and the withstand voltage may be decreased. Therefore, there is a possibility that it becomes impossible to obtain the withstand voltage required for the power device.

Further, in the case where the interval between the p type connection layers J6 is narrower than the interval between the p type deep layers J4 and the interval between the p type guard rings J5, the trench J10 becomes dense at the connection portion, and the film thickness of the epitaxial film J11 becomes thinner than other parts. For this reason, when the film is etched back, the same etching amount is removed from the surface, so that the connection portion has a recessed shape. In this case, if the etch-back amount is increased in order to remove the residue in the guard ring portion, the n⁻ type drift layer J2 and the p type connection layer J6 are further thinned at the connection portion, and therefore, a possibility of decreasing the break down voltage may be increased.

Therefore, in the present embodiment, the interval between the adjacent p type guard rings 21 is set to be equal to or less than the interval between the p type deep layers 5. Therefore, it is possible to suppress that the p type layer 50 is formed to be thick in the guard ring portion by increasing the distance between the p type guard rings 21, that is, by sparsely forming the trenches 21a. Therefore, by removing the p type layer 50 in the cell portion at the time of the etch back process, it is possible to remove the p type layer 50 without leaving any residue in the guard ring portion. Therefore, when the p type deep layer 5, the p type guard ring 21 and the p type connection layer 30 are formed by etching back the p type layer 50, residues of the p type layer 50 is suppressed from remaining in the guard ring portion.

As a result, even when the p type deep layer 5, the p type guard ring 21 and the p type connection layer 30 are constituted by an epitaxial film, it is possible to obtain a SiC semiconductor device having a semiconductor element with securing a breakdown voltage.

In the case where the interval between the adjacent p type guard rings 21 is made narrower than the interval between the p type deep layers 5 as in the present embodiment, as compared with the conventional SiC semiconductor device, the number of the p type guard rings 21 increases. In this case, although the area of the guard ring portion is increased, it is possible to suppress a reduction in breakdown voltage of the element.

Figure 6A:
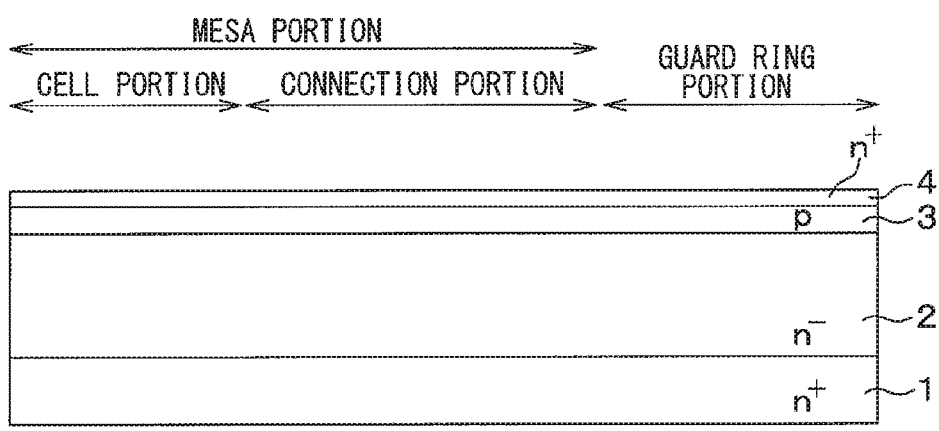
FIG. 6A is a cross-sectional view showing a state during a manufacturing process when the width of the connection layer is increased as a reference example.
Figure 6B:
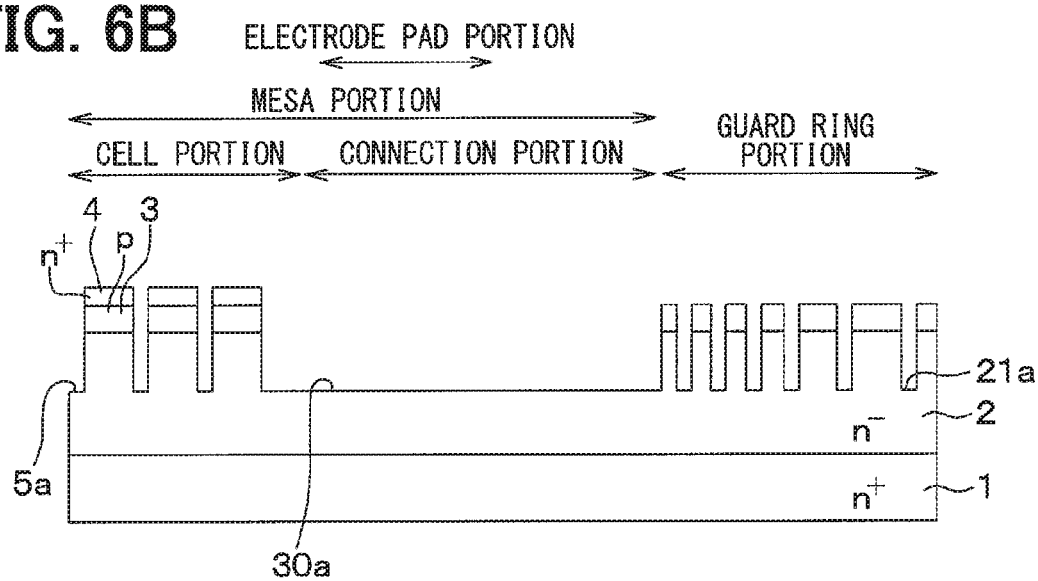
FIG. 6B is a cross-sectional view showing a manufacturing process of the SiC semiconductor device continued from FIG. 6A.
Figure 6C:
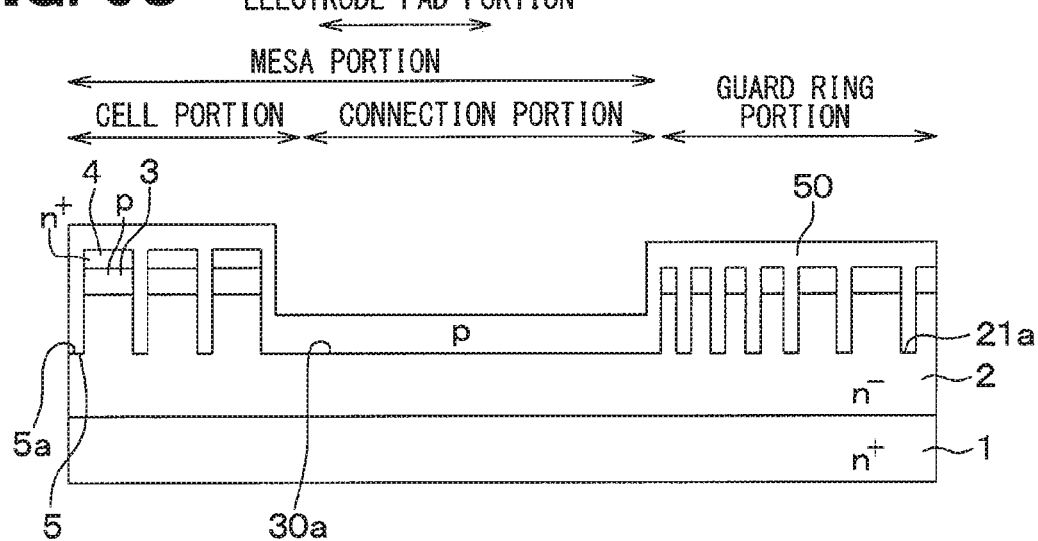
FIG. 6C is a cross-sectional view showing a manufacturing process of the SiC semiconductor device continued from FIG. 6B.
Figure 6D:
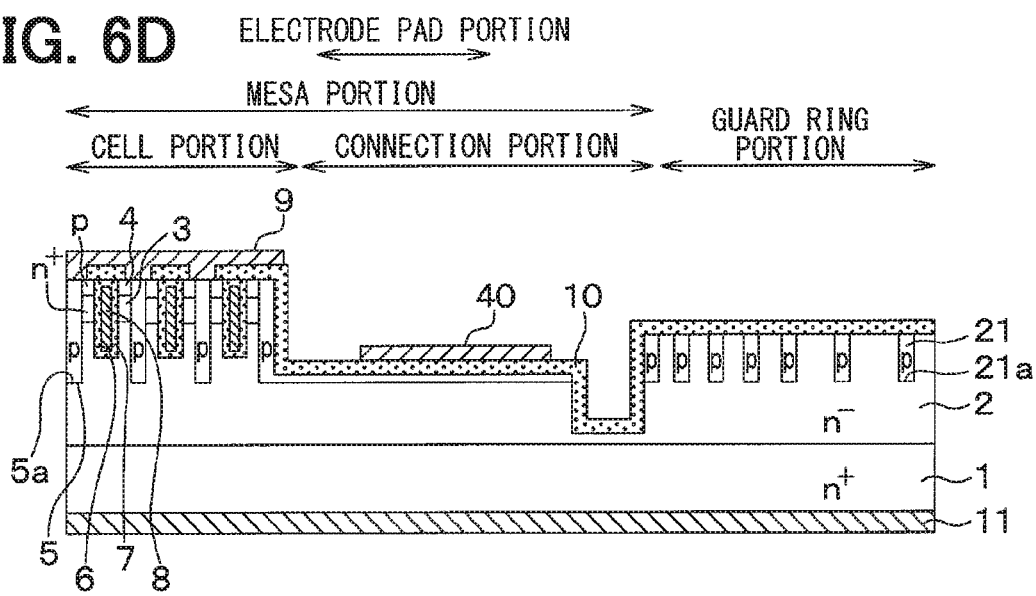
FIG. 6D is a cross-sectional view showing a manufacturing process of the SiC semiconductor device continued from FIG. 6C.

For reference, when using the epitaxial film, when the width of the p type connection layer 30 is made larger than those of the p type deep layer 5 and the p type guard ring 21, a feature such that the thickness of the p type connection layer 30 becomes thinner and an area where the p type connection layer 30 is eliminated is generated will be described with reference to the drawings. FIGS. 6A to 6D show a manufacturing process in the case where the entire region between the cell portion and the guard ring portion is formed as the p type connection layer 30 without narrowing the width of the p type connection layer 30. The steps shown in FIGS. 6A and 6B are performed similar to the steps in FIGS. 3A and 3B. At this time, the width of the trench 30a is set to be the width corresponding to the entire region from the cell portion to the guard ring portion. In the step of FIG. 6C, when the p type layer 50 is deposited in the same manner as in FIG. 3C, since the width of the trench 30a is large, the thickness of the portion of the p type layer 50 constituting the p type connection layer 30 becomes thin. Thereafter, when the p type layer 50 is etched back, the thickness of the connection layer 30 becomes thin, and the p type layer 50 remains only at the bottom of the trench 30a. Further, when etching is performed using a mask not shown which has an opening at the guard ring portion while covering the mesa portion, the connection layer 30 is completely eliminated on the outer peripheral side from the mesa portion, and further the n⁻ type drift layer 2 is etched. Therefore, as shown in FIG. 6D, in the region where the mesa portion is to be formed, the connection layer 30 becomes thin and the connection layer 30 does not exist in the region outside the mesa portion. Therefore, by narrowing the width of the connection layer 30 as in the present embodiment, it is possible to solve the difficulty such as thinning of the connection layer 30. Therefore, it is possible to secure the withstand voltage required for the power device.

Second Embodiment

A second embodiment will be described. The present embodiment is different from the first embodiment in the step of forming the concave portion 20, and the other steps are the same as in the first embodiment, so only the difference from the first embodiment will be described.

In the present embodiment, the concave portion 20a is formed using the process shown in FIG. 3D, in contrast to the above-described first embodiment.

Figure 7A:
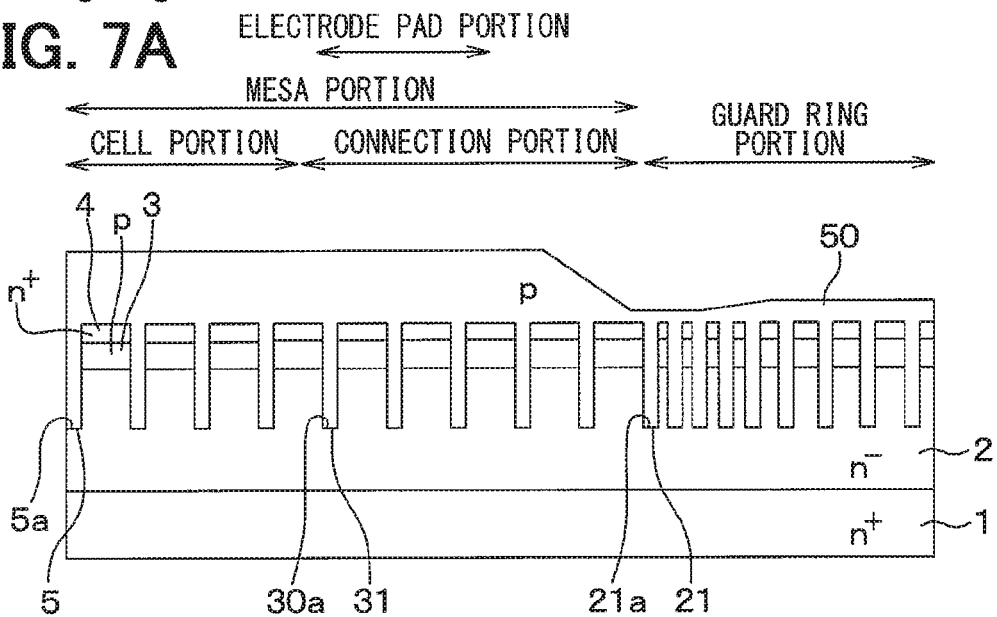
FIG. 7A is a cross-sectional view showing a manufacturing process of a SiC semiconductor device according to the second embodiment.
Figure 7B:
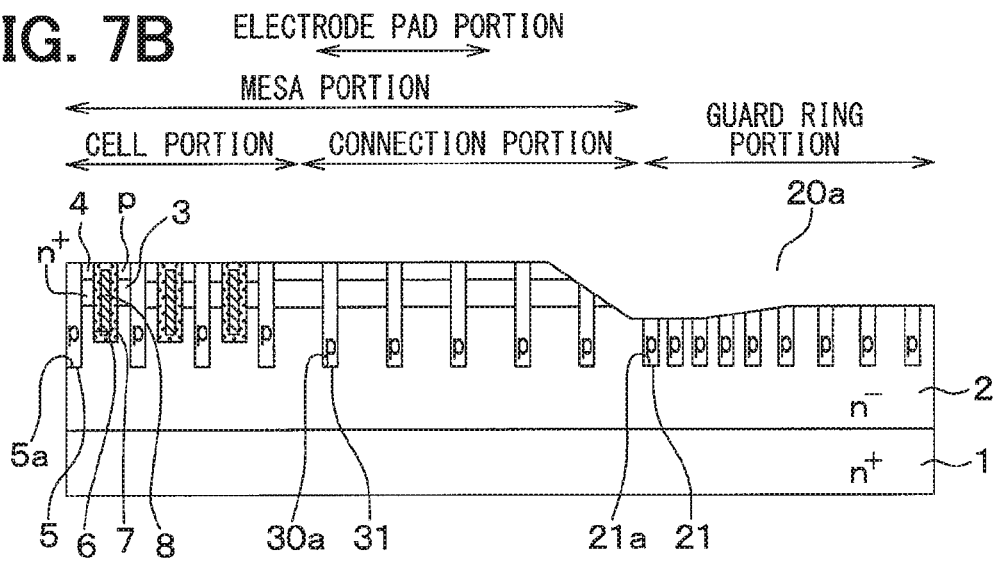
FIG. 7B is a cross-sectional view showing a manufacturing process of the SiC semiconductor device continued from FIG. 7A.

Specifically, the concave portions 20a are formed by etching back the p type layer 50 shown in FIG. 3D. That is, as shown in FIG. 7A, the thickness of the p type layer 50 is the thickest in the cell portion, and in the guard ring portion, the thickness is thinner than the cell portion and the connection layer. At this time, in order that the difference in thickness of the p type layer 50 is at least larger than the thickness of the p type base region 3, preferably not less than the total thickness of the p type base region 3 and the n⁺ type source region 4, the interval between the trenches 5a, 21a, 30a is set. For example, by setting the interval between the outermost one of the trenches 21a and the one of the trenches 21a inside the outermost one to be smaller than the interval between the trenches 5a, the thickness of the p type layer 50 is set to the above-mentioned thickness. Then, as shown in FIG. 7B, at the time of etch back, the p type base region 3 and the n⁺ type source region 4 are removed in the guard ring portion so as to expose the n⁻ type drift layer 2. By performing the above step, the p type base region 3 and the n⁺ type source region 4 remain in the mesa portion, and in the guard ring portion, the concave portion 20a in which the step portion with the mesa portion gently inclines can be formed in a self-aligned manner. In addition, since the step portion is gently inclined, the film thickness of the interlayer insulation film 10 formed thereon can be made uniform and reliability can be improved.

In this way, while forming the p type deep layer 5, the p type guard ring 21 and the p type connection layer 30 by etching back the p type layer 50, the concave portion 20a can also be formed at the same time. Therefore, it is possible to simplify the manufacturing process.

Third Embodiment

A third embodiment will be described. This embodiment is a modification of the structure of the p type deep layer 5 and the like with respect to the first embodiment, and other features are similar to the first embodiment, so only the parts different from the first embodiment will be explained.

Figure 8:
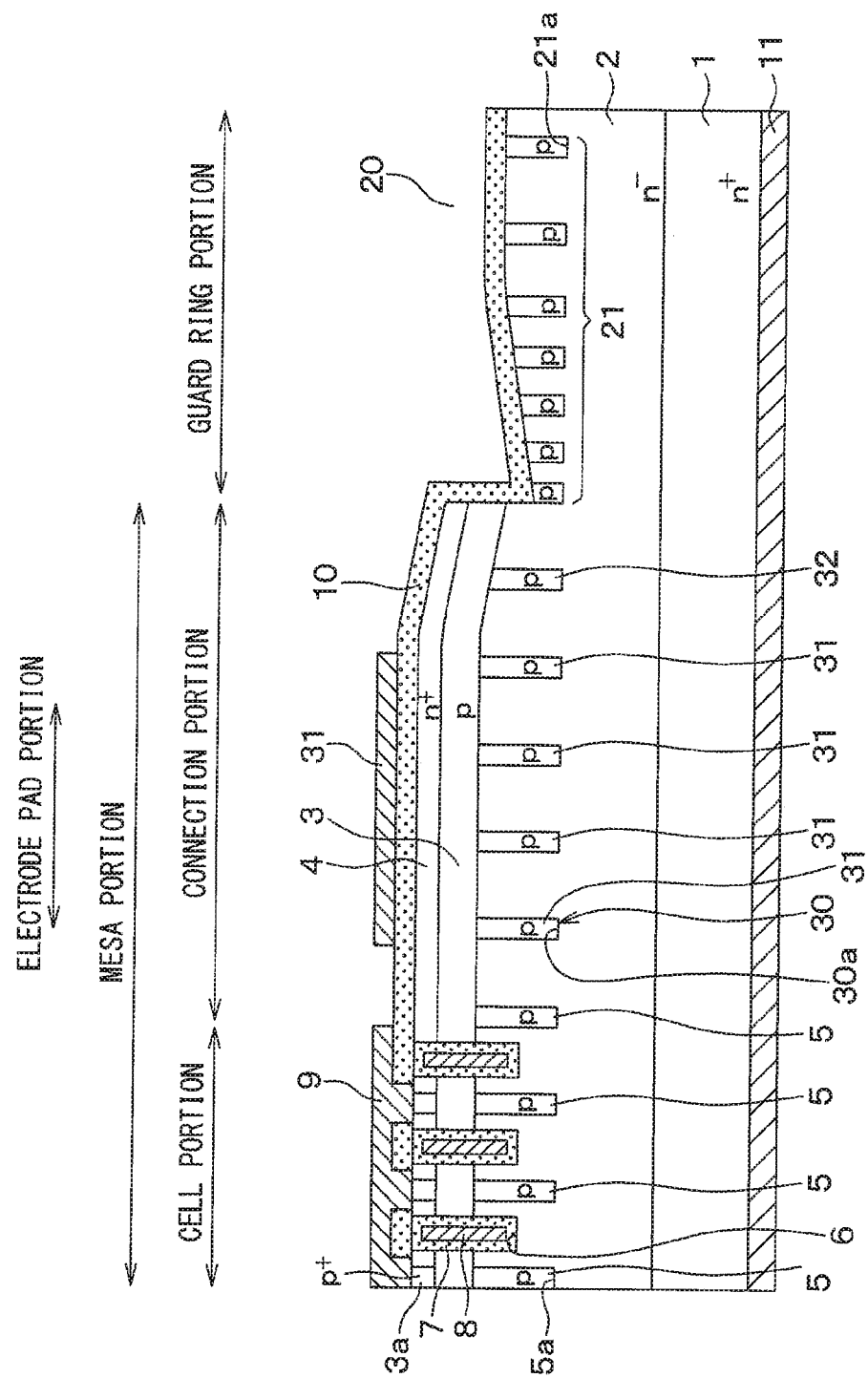
FIG. 8 is a cross-sectional view of a SiC semiconductor device according to a third embodiment.

As shown in FIG. 8, in the present embodiment, the widths of the p type deep layer 5, the p type connection layer 30 and the p type guard ring 21 and the interval between the respective parts are the same as in the first embodiment, but the p type deep layer 5 and the p type connection layer 30 are formed only under the p type base region 3. Then, in order to electrically connect the p type base region 3 and the source electrode 9, ion implantation is performed to the n⁺ type source region 4 so that the p⁺ type contact portion 3a is formed. As a result, the p⁺ type contact portion 3a is electrically connected to the source electrode 9, and the potentials of the p type deep layer 5 and the p type connection layer 30 becomes the source potential through the p type base region 3. Even with such a structure, the same effect as in the first embodiment can be obtained.

In the manufacturing method of the SiC semiconductor device having such a structure, after forming the n⁻ type drift layer 2 and before forming the p type base region 3, the p type layer 50 is formed and etched back. Thus, the p type deep layer 5, the p type connection layer 30 and the p type guard ring 21 are formed. At this time, when the p type layer 50 is etched back, the surface of the n⁻ type drift layer 2 is recessed in part of the guard ring portion and in part of the connection portion due to the concavities and convexities of the surface of the p type layer 50. However, there is no difficulty even when the p type base region 3 and the n⁺ type source region 4 are formed thereon. Further, after forming the n⁺ type source region 4, ion implantation of p type impurity is performed at a position corresponding to the p type deep layer 5 in the n⁺ type source region 4 using a mask not shown, so that a step for forming the p⁺ type contact portion 3a is carried out. The other steps are the same as those in the first embodiment.

Fourth Embodiment

A fourth embodiment will be described. In this embodiment, a junction barrier Schottky diode (hereinafter referred to as JBS) is provided instead of the vertical MOSFET as the power element in the first embodiment. Since the others are the same as those in the first embodiment, only the parts different from the first embodiment will be described.

Figure 9:
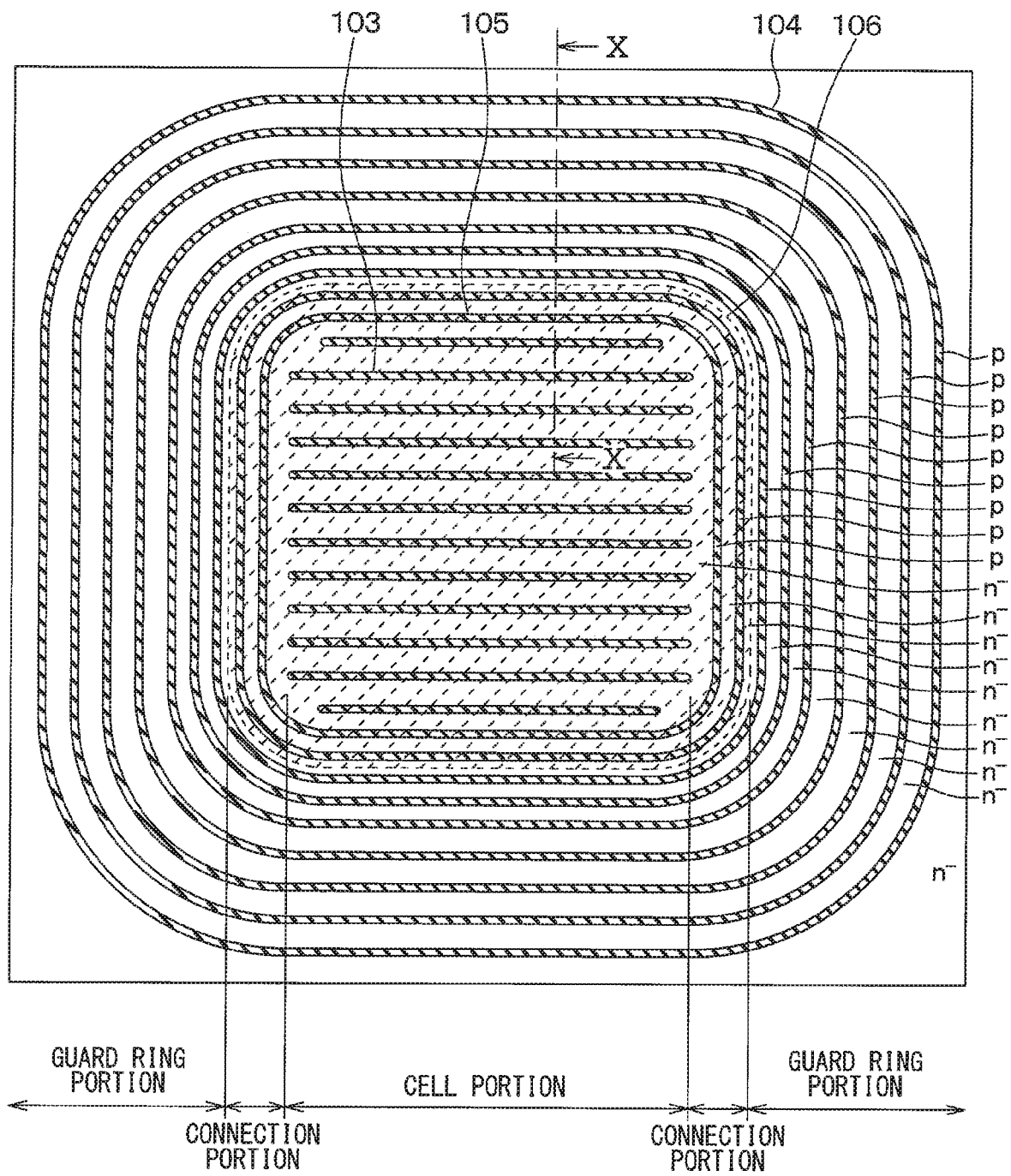
FIG. 9 is a diagram schematically showing a top layout of a SiC semiconductor device according to a fourth embodiment.
Figure 10:
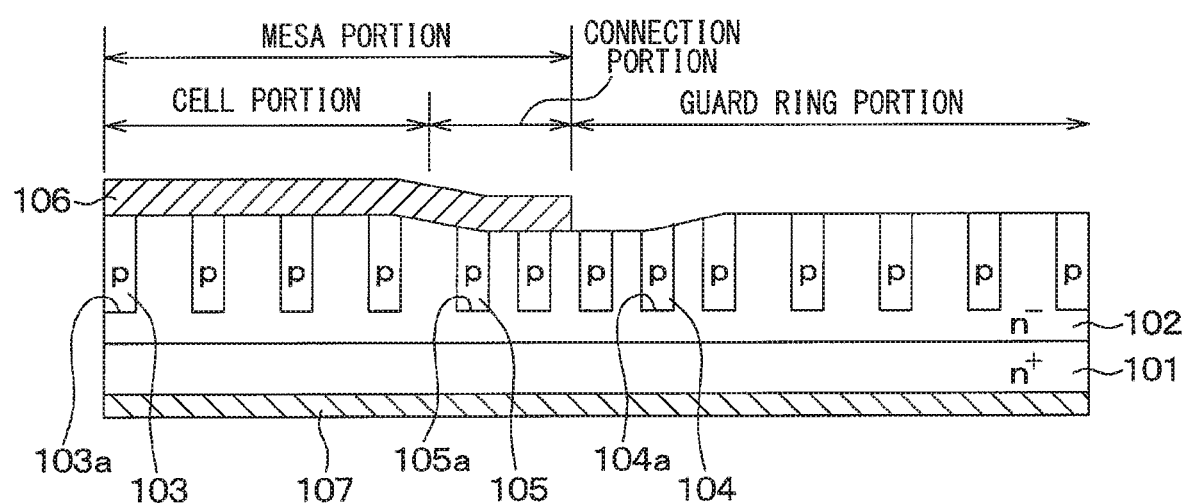
FIG. 10 is a cross-sectional view taken along the line X-X in FIG. 9.

The SiC semiconductor device according to this embodiment will be described with reference to FIGS. 9 and 10. As shown in FIG. 10, an n⁻ type drift layer 102 is formed on an n⁺ type substrate 101. As shown in FIGS. 9 and 10, in the cell portion, a stripe-shaped p type deep layer 103 is formed with respect to the n⁻ type drift layer 102, and in the guard ring portion surrounding the p type deep layer 103, the p type guard ring 104 is formed. In addition, a p type connection layer 105 is also formed at the connection portion between the cell portion and the guard ring portion.

The p type deep layer 103 is disposed in each of a plurality of stripe-shaped trenches 103a which are arranged at equal intervals in the n⁻ type drift layer 102, and the deep layer 103 is made of a p type epitaxial film by epitaxial growth. The trench 103a corresponds to a deep trench, and has a depth of, for example, 1 micrometer or less and an aspect ratio of 2 or more. In addition, the tip of the p type deep layer 103 has a semicircular top shape.

The p type guard ring 104 is disposed in the trench 104a formed in the n⁻ type drift layer 102, and is made of a p type epitaxial film by epitaxial growth. The trench 104a corresponds to a guard ring trench, and has a depth of, for example, 1 micrometer or less and an aspect ratio of 2 or more. In the case of the present embodiment, the p type guard ring 104 has a quadrangular shape in which the four corners are rounded. Alternatively, the ring 104 may have another frame shape such as a circular shape.

The p type connection layer 105 is disposed in the trench 105a formed in the n⁻ type drift layer 102, and is made of a p type epitaxial film by epitaxial growth. The trench 105a corresponds to a connection trench, and has a depth of, for example, 1 micrometer or less and an aspect ratio of 2 or more. In the case of the present embodiment, the p type connection layer 105 has a configuration in which a plurality of frame-shaped members surrounding the periphery of the p type deep layer 103 formed in the cell portion are arranged, and in the present embodiment, the connection layer 105 is arranged to be narrower than the interval between the adjacent p type guard rings 21.

A Schottky electrode 106 corresponding to the first electrode in contact with the surface of the n⁻ type drift layer 102, the p type deep layer 103 and the p type connection layer 105 is formed in the cell portion and the connection portion. That is, in the case of the present embodiment, a plurality of p type rings made of a p type layer, which is provided by arranging an epitaxial film in a frame-shaped trench with a frame shape surrounding a cell portion, are arranged, and a Schottky electrode 106 is disposed so as to cover a part of the p type rings on the inner circumferential side. Among such plural p type rings, the p type ring in contact with the Schottky electrode 106 is defined as a p type connection layer 105. Further, among the plurality of p type rings, the p type ring, which are not in contact with the Schottky electrode 106 but are positioned at the outer side from the Schottky electrode 106 and are disposed at the position where the n⁻ type drift layer 102 is exposed, is defined as a p type guard ring 104. In the portion where the Schottky electrode 106 is formed, in the thickness direction of the n⁺ type substrate 101, the position of the cell portion where the Schottky electrode 106 is arranged and the position of the connection portion are protruded from the guard ring portion so as to form the mesa portion.

Further, an ohmic electrode 107 corresponding to the second electrode is formed on the back side of the n⁺ type substrate 101.

As described above, also in the SiC semiconductor device having the JBS as a power element, the distance between the p type guard rings 104 is set to be equal to or less than the interval of the p type deep layer 103 so that the residue does not remain at the position where the p type guard ring 104 is to be formed. Even with such a structure, the same effect as in the first embodiment can be obtained. Since such an effect can be obtained, in the SiC semiconductor device having the JBS, the Schottky electrode 106 can be made to have a small barrier height, the on-state voltage can be reduced, and the surface electric field can be reduced. Further, as compared with the case where a p type layer such as the p type deep layer 103 is formed by ion implantation method, defects are less likely to occur, so that reverse leakage can also be reduced.

Other Embodiments

Although the present disclosure is made based on the embodiments described above, the present disclosure is not limited to such embodiments but includes various changes and modifications which are within equivalent ranges. Furthermore, various combination and formation, and other combination and formation including one, more than one or less than one element may be made within the spirit and scope of the present disclosure.

(1) For example, in each of the above-described embodiments, the case where the both ends in the longitudinal direction of the linear portion 31 of the p type connection layer 30 and the p type deep layer 103 are semicircular has been described. Alternatively, the tip may be sharp triangular shape, or a quadrangular shape with a flat plane. In the case of a triangular shape, when the extending direction of the straight portion 31 and the p type deep layer 103 is the <11-20> direction, in a hexagonal crystal structure such as SiC, the plane orientation of the wall for constituting the two sides of the tip, which is triangular, tends to be equivalent (1-100) plane. Therefore, the growth at the epitaxial embedding process on each equivalent surface becomes uniform so as to form the uniform film quality and to obtain the effect of suppressing the embedding failure.

Further, the p type deep layer 5 or the linear portion 31 may have a structure in which the tip thereof is in contact with the frame portion 32. In that case, the trench width becomes large at the portion where the tip of the p type deep layer 5 or the linear portion 31 contacts the frame portion 32, and the surface of the p type layer 50 is recessed. Therefore, the width of the tip of the p type deep layer 5 or the linear portion 31 and the width of the frame portion 32 at the portion where the tip of the p type deep layer 5 or the linear portion 31 contacts the frame portion 32 are set to be narrower than other portions.

(2) In the third embodiment, in order to connect the p type base region 3 to the source electrode 9, a p⁺ type contact portion 3a is formed so as to penetrate the n⁺ type source region 4 and to reach the p type base region 3. Alternatively, a trench penetrating the n⁺ type source region 4 may be formed so that the source electrode 9 directly contacts the p type base region 3.

(3) In each of the above embodiments, the n⁺ type source region 4 is epitaxially grown continuously on the p type base region 3. Alternatively, the n⁺ type source region 4 may be formed by implanting ions of n type impurity at a desired position of the p type base region 3.

(4) In each of the above embodiments, an n channel type inverted trench gate MOSFET or a Schottky diode has been described as an example of a vertical power element. Each of the above embodiments merely shows one example of a vertical type semiconductor element. Therefore, alternatively, a vertical type semiconductor element may have another structure and/or another conductivity type as long as the vertical type semiconductor element flows a current between a first electrode provided on the front surface side of the semiconductor substrate and a second electrode provided on the back surface side.

For example, in the first embodiment, an n channel type MOSFET in which the first conductivity type is n type and the second conductivity type is p type has been described as an example. Alternatively, the conductivity type of each element may be reversed so as to form a p channel type MOSFET. In the above description, the MOSFET is described as an example of a semiconductor element. Alternatively, the present disclosure may also be applied to an IGBT having a similar structure. In the IGBT, only the conductivity type of the n⁺ type substrate 1 is changed from the n type to the p type with respect to each of the above embodiments, and other structures and manufacturing methods are the same as those of the above embodiments. Furthermore, the trench gate structure in the vertical type MOSFET has been described as an example. Alternatively, it is not limited to a trench gate structure and may be a planar type MOSFET.

(5) In the above-described first and second embodiments, the frame portion 32 and the p type guard ring 21 having a frame shape are arranged on the outer circumferential side of the connection portion and the guard ring portion, and a line-shaped p type deep layer 5 and a straight portion 31 which provide a stripe shape are arranged at a part of the cell portion and the connection portion. However, this is merely an example. For example, similarly to the fourth embodiment, the connection portion may be constituted solely by the frame portion 32, and a whole of the inner portion thereof is the cell portion, so that a line-shaped p type deep layer 5 having the stripe shape may be arranged.

In each of the above embodiments, the trench constituting the stripe-shaped line-shaped second conductivity type layer corresponds to the first trench and the trench constituting the frame-shaped second conductivity type ring corresponds to the second trench. That is, in the first and second embodiments, the portion of the trench 5a and the trench 30a, in which the linear portion 31 is provided, corresponds to the first trench, and the portion of the trench 30a where the frame portion 32 is provided and the trench 21a correspond to the second trench. In the fourth embodiment, the trench 103a corresponds to the first trench, and the trenches 104a and 105a correspond to the second trench.

(6) In the first embodiment, the mesa portion is provided by forming the concave portion 20. It is not always necessary to provide the mesa portion. For example, as in the third embodiment, the p type deep layer 5 and the like are formed from the surface of the n⁻ type drift layer 2. Thereafter, a trench is formed in a region where the p type base region 3 and the n⁺ type source region 4 are designed to be formed, and a p type layer and an n⁺ type layer are selectively epitaxially grown in the trench to form a p type base region 3 and an n⁺ type source region 4. Alternatively, a p-type impurity or an n-type impurity is selectively ion-implanted into a region where the p type base region 3 and the n⁺ type source region 4 are designed to be formed, so that the p type base region 3 and the n⁺ type source region 4 are formed. In this way, a SiC semiconductor device having a structure without a mesa portion can be obtained. Even in this case, when the structure of the connection portion and the guard ring portion has the same structure as in the first embodiment, the same effect as in the first embodiment can be obtained.

(7) In the case of indicating the crystal orientation, a bar (-) should be added over a desired number properly. Since there is restriction on expression based on electronic filing, in the present specification, a bar is attached before a desired number.

The invention claimed is:

1. A silicon carbide semiconductor device having a cell portion and a peripheral portion that includes a guard ring portion surrounding an outer periphery of the cell portion and a connection portion positioned between the guard ring portion and the cell portion, the semiconductor device comprising:
   a substrate having a first or second conductivity type; and
   a drift layer having the first conductivity type, arranged on a surface of the substrate, and having an impurity concentration lower than the substrate, wherein:
   the cell portion, or the cell portion and the connection portion includes a second conductivity type layer that is arranged in a plurality of line-shaped first trenches having a stripe shape and disposed in the drift layer, and is made of an epitaxial film having the second conductivity type;
   the cell portion includes a vertical type semiconductor element that has: a first electrode electrically connected to the second conductivity type layer; and a second electrode arranged on a back side of the substrate, and flows a current between the first electrode and the second electrode;
   the guard ring portion, or the guard ring portion and the connection portion includes a second conductivity type ring that is arranged in a plurality of line-shaped second trenches having a stripe shape, disposed from a surface of the drift layer, and surrounding the cell portion, and is made of an epitaxial film having the second conductivity type;
   at least a part of the second conductivity type ring located on an outer circumference side functions as a guard ring arranged in the guard ring portion;
   an interval between adjacent guard rings becomes larger toward the outer circumference side of the cell portion; and
   a largest interval between the adjacent guard rings is equal to or smaller than an interval between adjacent second conductivity type layers.

2. The silicon carbide semiconductor device according to claim 1, wherein:
   an interval between an outermost peripheral guard ring and a guard ring disposed inside next to the outermost peripheral guard ring is equal to the interval between the adjacent second conductivity type layers.

3. The silicon carbide semiconductor device according to claim 1, wherein:
   an interval between an outermost peripheral guard ring and a guard ring disposed inside next to the outermost peripheral guard ring is smaller than the interval between the adjacent second conductivity type layers.

4. The silicon carbide semiconductor device according to claim 1, wherein:
   the cell portion includes the vertical type semiconductor element that further has:
   a base region having the second conductivity type and arranged on the drift layer;
   a source region having the first conductivity type, arranged above the base region, and having an impurity concentration higher than the drift layer;
   a trench gate structure with a gate insulation film that is arranged in a gate trench positioned from the surface of the source region to a depth deeper than the base region, and is located on an inner wall of the gate trench, and a gate electrode arranged on the gate insulation film;
   a deep layer providing at least a part of the second conductivity type layer, and arranged in a deep trench that is included in at least a part of the first trenches and is located to a position deeper than the gate trench in the drift layer;
   a source electrode providing the first electrode electrically connected to the source region and the base region; and
   a drain electrode providing the second electrode and arranged on the back side of the substrate.

5. The silicon carbide semiconductor device according to claim 1, wherein:
   the substrate has the first conductivity type;

the cell portion includes a vertical type Schottky diode that has:
- a deep layer disposed in a deep trench included in at least a part of the first trenches, and providing at least a part of the second conductivity type layer;
- a Schottky electrode providing the first electrode which contacts the drift layer (102) and the deep layer; and
- an ohmic electrode providing the second electrode and disposed on the back side of the substrate.

6. A manufacturing method of a silicon carbide semiconductor device having a cell portion and an outer peripheral portion surrounding an outer periphery of the cell portion, the manufacturing method of the semiconductor device comprising:
- preparing a substrate having a first or second conductivity type;
- forming a drift layer having the first conductivity type with an impurity concentration lower than the substrate on a surface of the substrate;
- forming a base region having the second conductivity type on the drift layer;
- forming a source region having the first conductivity type with an impurity concentration higher than the drift layer on the base region;
- forming a plurality of trenches by performing an anisotropic etching from the surface of the source region, the trenches including a deep trench in the cell portion, a guard ring trench in a guard ring portion surrounding the outer periphery of the cell portion, and a connection trench in a connection portion located between the cell portion and the guard ring portion;
- embedding the deep trench, the guard ring trench and the connection trench by epitaxially growing a second conductivity type layer;
- forming a deep layer in the deep trench, a guard ring in the guard ring trench, and a connection layer in the connection trench by etching-back and removing a part of the second conductivity layer disposed on the source region;
- forming a trench gate structure in the cell portion, the trench gate structure including a gate trench arranged from the surface of the source region and deeper than the base region, a gate insulation film arranged on an inner wall of the gate trench, and a gate electrode formed on the gate insulation film;
- forming a source electrode electrically connected to the source region and the base region; and
- forming a drain electrode on a back side of the substrate, wherein:
- in the forming of the plurality of trenches,
- the deep trench is formed to have a plurality of lines with a stripe shape;
- the guard ring trench is formed to have a plurality of lines with a frame shape surrounding the cell portion;
- the connection trench is formed to have at least one of a plurality of lines with a stripe shape and a plurality of lines with a frame shape surrounding the cell portion;
- an interval between adjacent guard ring trenches becomes large toward the outer periphery of the cell portion; and
- a largest interval between the adjacent guard rings is equal to or smaller than an interval between adjacent deep layers.

7. The manufacturing method of the silicon carbide semiconductor device according to claim 6, wherein:
- the forming of the deep layer by etching-back and removing includes:
  - by etching-back, removing the base region and the source region in the guard ring portion, and simultaneously forming a concave portion for exposing the guard ring and the drift layer; and
  - forming a mesa portion having an island shape and provided by protruding the cell portion and the connection portion from the guard ring portion in a thickness direction of the substrate.

8. A manufacturing method of a silicon carbide semiconductor device having a cell portion and an outer peripheral portion surrounding an outer periphery of the cell portion, the manufacturing method of the semiconductor device comprising:
- preparing a substrate having a first or second conductivity type;
- forming a drift layer having the first conductivity type with an impurity concentration lower than the substrate on a surface of the substrate;
- forming a plurality of trenches by performing an anisotropic etching from the surface of the drift layer, the trenches including a deep trench in the cell portion, a guard ring trench in a guard ring portion surrounding the outer periphery of the cell portion, and a connection trench in a connection portion located between the cell portion and the guard ring portion;
- embedding the deep trench, the guard ring trench and the connection trench by epitaxially growing a second conductivity type layer;
- forming a deep layer in the deep trench, a guard ring in the guard ring trench, and a connection layer in the connection trench by etching-back and removing a part of the second conductivity layer disposed on the drift layer;
- forming a base region having the second conductivity type on the deep layer, the guard ring and the connection layer and on the drift layer;
- forming a source region having the first conductivity type with an impurity concentration higher than the drift layer on the base region;
- forming a trench gate structure in the cell portion, the trench gate structure including a gate trench arranged from the surface of the source region and deeper than the base region, a gate insulation film arranged on an inner wall of the gate trench, and a gate electrode formed on the gate insulation film;
- forming a source electrode electrically connected to the source region and the base region; and
- forming a drain electrode on a back side of the substrate, wherein:
- in the forming of the plurality of trenches,
- the deep trench is formed to have a plurality of lines with a stripe shape;
- the guard ring trench is formed to have a plurality of lines with a frame shape surrounding the cell portion;
- the connection trench is formed to have at least one of a plurality of lines with a stripe shape and a plurality of lines with a frame shape surrounding the cell portion;
- an interval between adjacent guard ring trenches becomes large toward the outer periphery of the cell portion; and
- a largest interval between the adjacent guard rings is equal to or smaller than an interval between adjacent deep layers.

9. A manufacturing method of a silicon carbide semiconductor device having a cell portion and an outer peripheral portion surrounding an outer periphery of the cell portion, the manufacturing method of the semiconductor device comprising:

preparing a substrate having a first conductivity type;

forming a drift layer having the first conductivity type with an impurity concentration lower than the substrate on a surface of the substrate;

forming a plurality of trenches by performing an anisotropic etching from the surface of the drift layer, the trenches including a deep trench in the cell portion, a guard ring trench in a guard ring portion surrounding the outer periphery of the cell portion, and a connection trench in a connection portion located between the cell portion and the guard ring portion;

embedding the deep trench, the guard ring trench and the connection trench by epitaxially growing a second conductivity type layer;

forming a deep layer in the deep trench, a guard ring in the guard ring trench, and a connection layer in the connection trench by etching-back and removing a part of the second conductivity layer disposed on the drift layer;

forming a Schottky electrode in contact with the drift layer, the deep layer and the connection layer in the cell portion and the connection portion; and forming an ohmic electrode on a back side of the substrate, wherein:

in the forming of the plurality of trenches, the deep trench is formed to have a plurality of lines with a stripe shape;

the guard ring trench and the connection trench are formed to have a plurality of lines with a frame shape surrounding the cell portion;

an interval between adjacent guard ring trenches becomes large toward the outer periphery of the cell portion; and a largest interval between the adjacent guard rings is equal to or smaller than an interval between adjacent deep layers.

* * * * *